US010104818B2

(12) United States Patent
Nash

(10) Patent No.: US 10,104,818 B2
(45) Date of Patent: Oct. 16, 2018

(54) DATA TRANSMISSION BLOCKING HOLDER

(75) Inventor: Michael Nash, Cary, IL (US)

(73) Assignee: Caged Idea's LLC, Cary, IL (US)

( * ) Notice: Subject to any disclaimer, the term of this patent is extended or adjusted under 35 U.S.C. 154(b) by 0 days.

(21) Appl. No.: 13/226,169

(22) Filed: Sep. 6, 2011

(65) Prior Publication Data
US 2012/0073873 A1 Mar. 29, 2012

Related U.S. Application Data

(63) Continuation-in-part of application No. 12/876,804, filed on Sep. 7, 2010, now Pat. No. 9,750,167.

(51) Int. Cl.
B65D 85/00 (2006.01)
H05K 9/00 (2006.01)
H04B 1/3888 (2015.01)

(52) U.S. Cl.
CPC ......... H05K 9/0045 (2013.01); H05K 9/0047 (2013.01); H04B 1/3888 (2013.01)

(58) Field of Classification Search
CPC .. G06F 1/1628; H05K 9/0045; H05K 9/0047; H04B 1/3888
USPC .................. 206/377, 459.1, 459.5, 320, 719; 307/113; 362/37, 155; 232/5, 13; 174/382; 361/818; 220/3.94
See application file for complete search history.

(56) References Cited

U.S. PATENT DOCUMENTS 3,181,693 A 5/1965 Freistat
4,494,651 A * 1/1985 Malcolm ........................ 206/719
4,925,045 A * 5/1990 Logsdon ............... E04G 15/061
220/3.94
5,777,261 A 7/1998 Katz
5,819,162 A * 10/1998 Spann et al. ............... 455/575.5
6,657,214 B1 * 12/2003 Foegelle et al. ........... 250/506.1
6,659,274 B2 * 12/2003 Enners .................. G06F 1/1626
206/305
(Continued)

FOREIGN PATENT DOCUMENTS

DE 10 2005 061336 A1 6/2007
JP 1019951 1/1998
(Continued)

OTHER PUBLICATIONS

Communication Relating to the Results of the Partial International Search for International Application No. PCT/US2011/050549 dated Apr. 5, 2012.
(Continued)

Primary Examiner — Rafael Ortiz
(74) Attorney, Agent, or Firm — K&L Gates LLP

(57) ABSTRACT

A personal communication device ("PCD") holder including (i) a first housing portion including a material that causes the first housing portion to be data signal blocking; (ii) a second housing portion including a material that causes the second housing portion to be data signal blocking; and (iii) a data signal blocking gasket fitted to at least one of the first and second housing portions, the gasket positioned and arranged such that when the first and second housing portions are mated together to form an enclosure about the PCD, the data signal blocking gasket engages and seals to the other of the first and second housing portions to ensure that the enclosure is completely data signal blocking regardless of whether imperfections are present in an interface between the mated first and second portions.

25 Claims, 12 Drawing Sheets

(56) References Cited

U.S. PATENT DOCUMENTS

| | | | |
|---|---|---|---|
| 7,342,184 B2* | 3/2008 | Cochrane | 174/367 |
| 7,663,879 B2* | 2/2010 | Richardson | G06F 1/1613 206/320 |
| 8,203,850 B2* | 6/2012 | Bouza et al. | 361/800 |
| 8,360,378 B1* | 1/2013 | Owens | 248/309.4 |
| 2003/0057131 A1* | 3/2003 | Diaferia | 206/719 |
| 2005/0029137 A1* | 2/2005 | Wang | 206/320 |
| 2005/0090299 A1 | 4/2005 | Tsao | |
| 2006/0260838 A1* | 11/2006 | Ariel | 174/350 |
| 2007/0204742 A1 | 9/2007 | Wilkerson | |
| 2007/0261978 A1* | 11/2007 | Sanderson | 206/320 |
| 2009/0146862 A1* | 6/2009 | Malone | 342/1 |
| 2010/0008028 A1* | 1/2010 | Richardson | G06F 1/1626 361/679.01 |
| 2010/0126766 A1 | 5/2010 | Lynam | |
| 2010/0171234 A1 | 7/2010 | Lee et al. | |
| 2011/0035695 A1* | 2/2011 | Fawcett et al. | 715/773 |
| 2011/0198245 A1* | 8/2011 | Soufan | 206/216 |
| 2012/0037536 A1* | 2/2012 | Lonsdale, II | G06F 1/16 206/701 |

FOREIGN PATENT DOCUMENTS

| | | |
|---|---|---|
| JP | 1032398 | 2/1998 |
| JP | 11346081 | 12/1999 |
| JP | 2001044680 | 2/2001 |
| JP | 2007261100 | 10/2007 |
| JP | 2011054917 | 3/2011 |

OTHER PUBLICATIONS

International Search Report PCT/US2011/050549 dated Jul. 4, 2012—7 pages.
Written Opinion of the International Searching Authority PCT/US2011/050549 dated Jul. 4, 2012—10 pages.
IPRP PCT/US2011/050549 dated Mar. 20, 2013—6 pages.
U.S. Appl. No. 12/876,804; Final Office Action dated Aug. 15, 2013.
Examination Report dated Feb. 13, 2014 for related Great Britain Appln. No. GB1306201.3.
Office Action received in GB Application 1415266.4 dated Sep. 24, 2014. 7 pages.

* cited by examiner

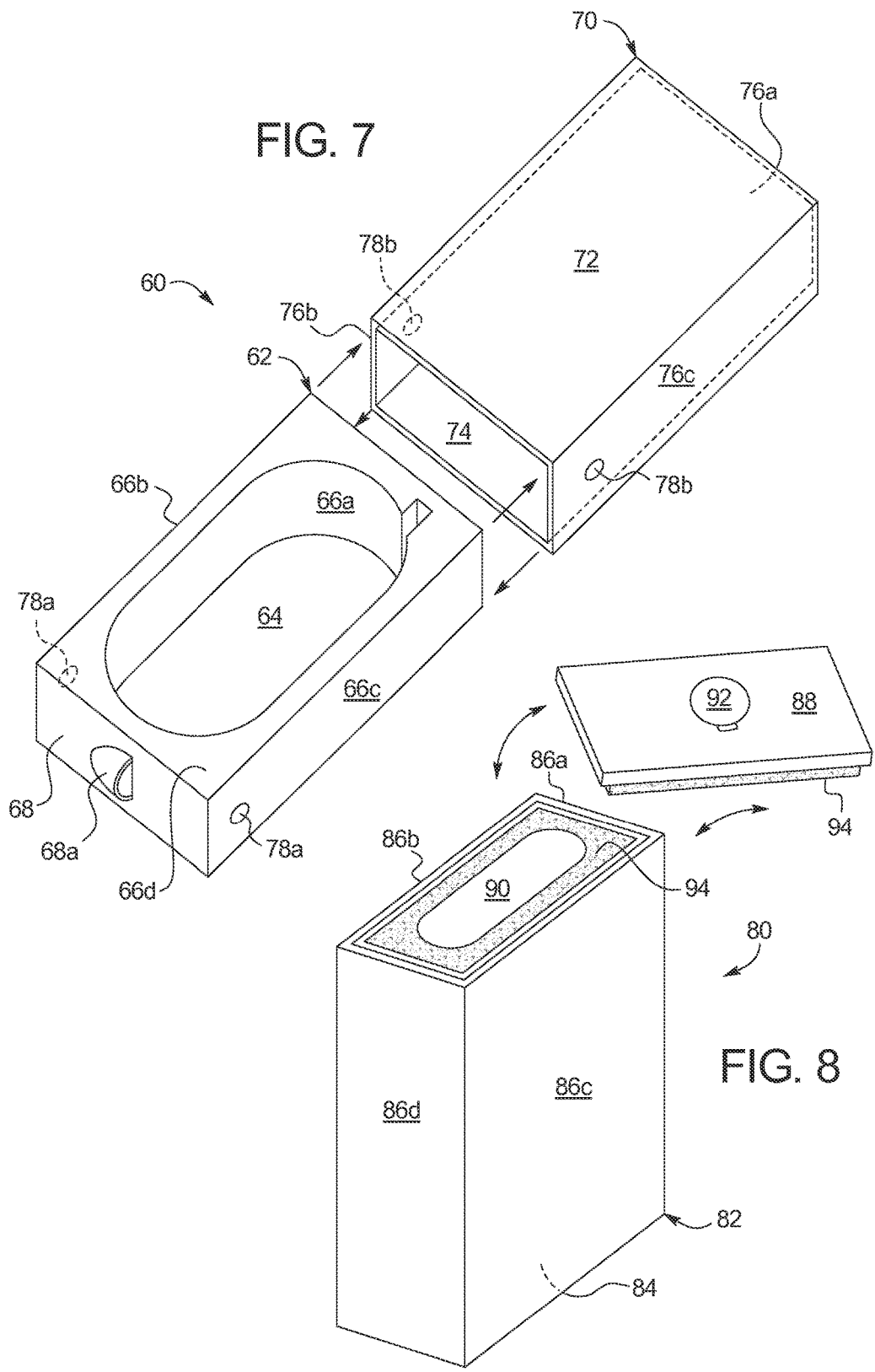

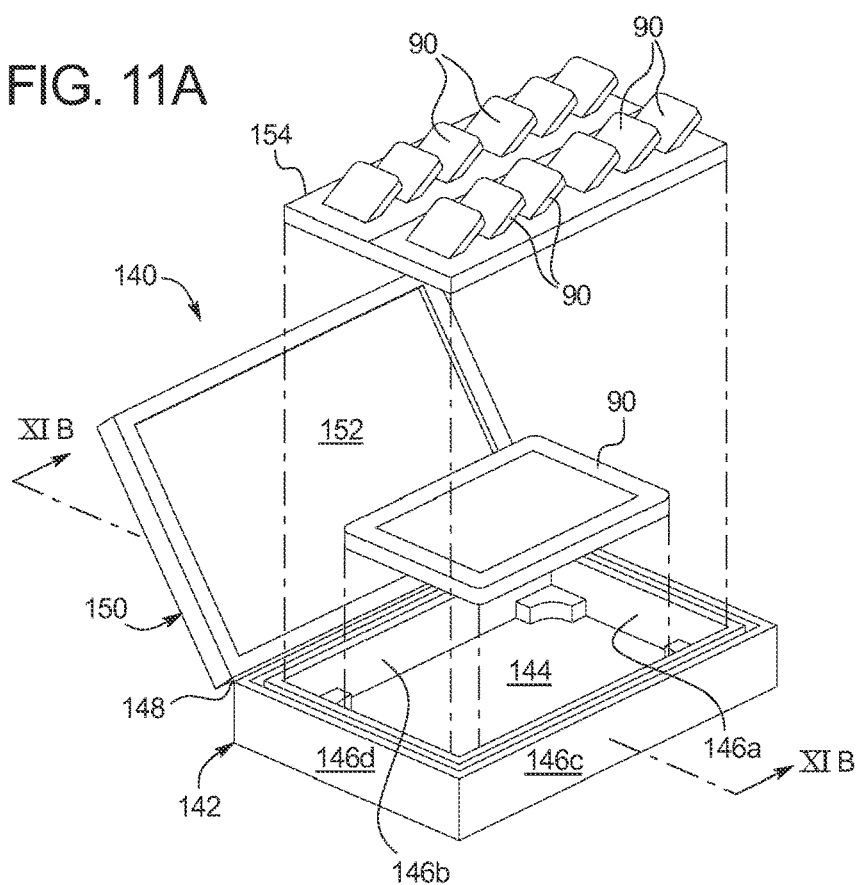
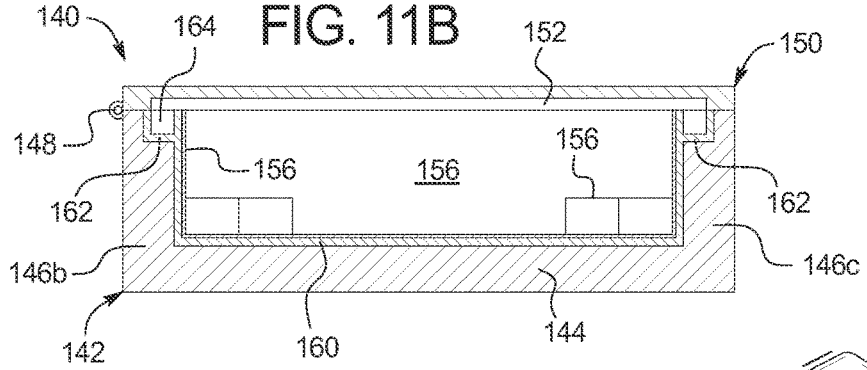
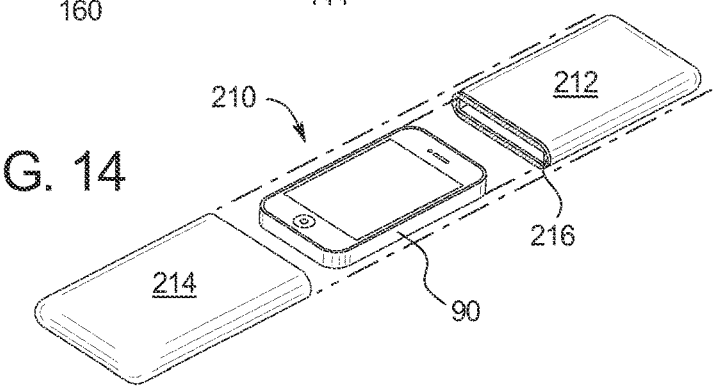

FIG. 13A
FIG. 13B
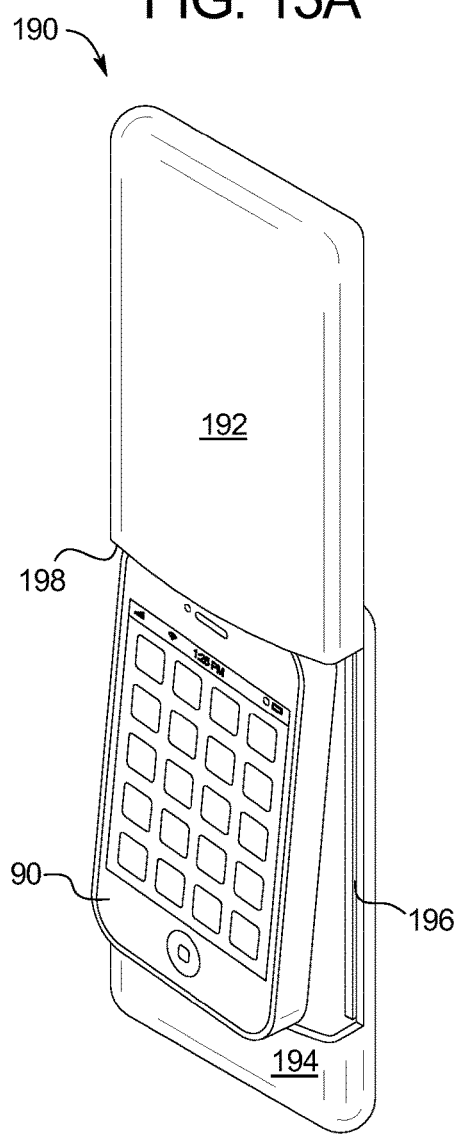
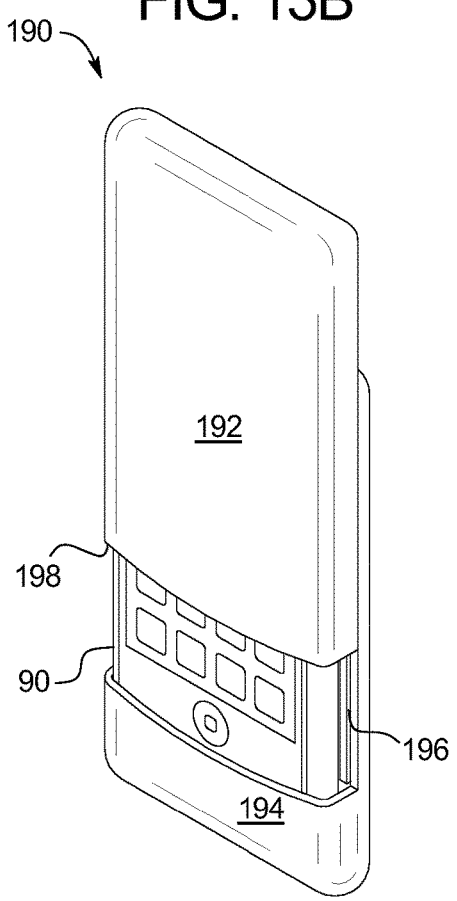

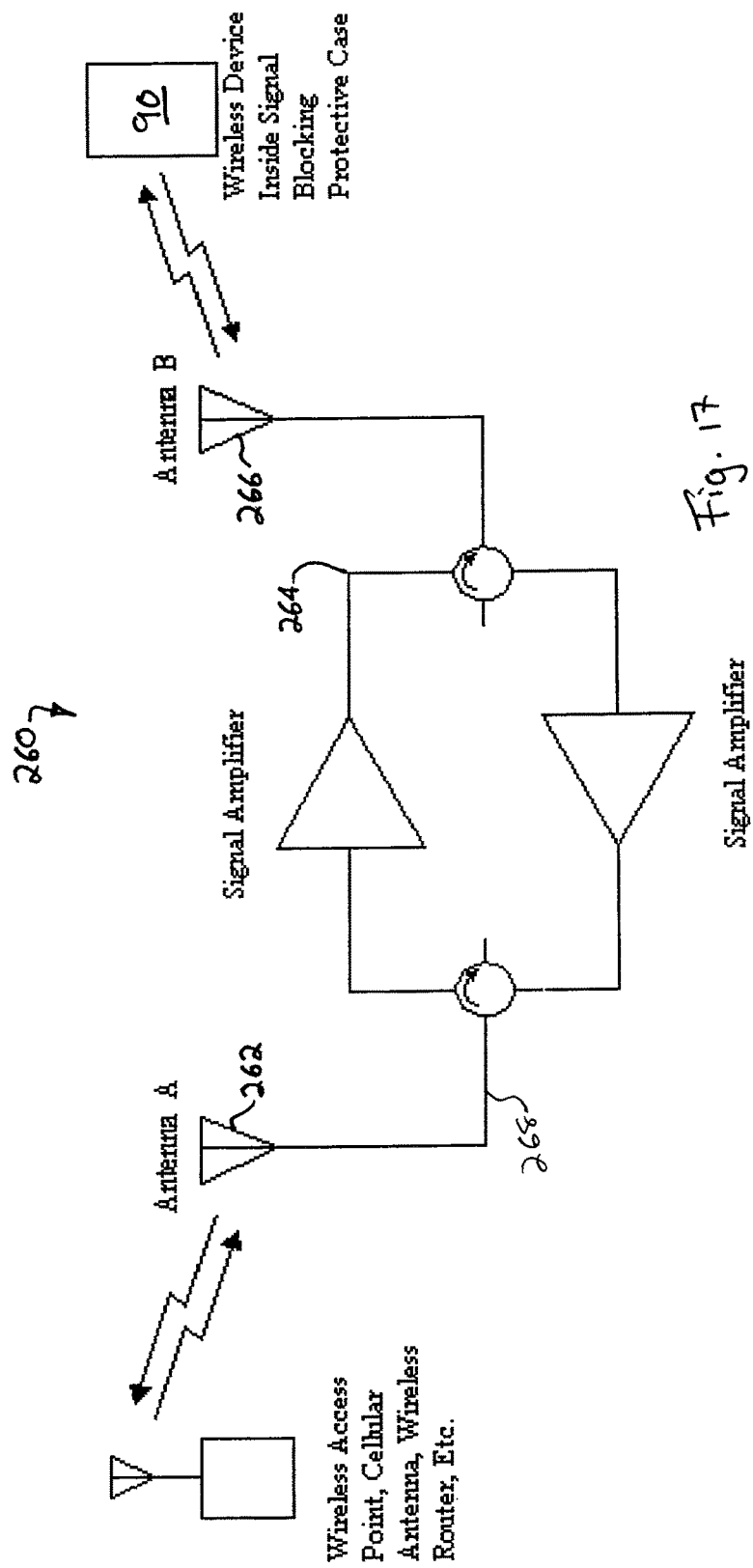

DATA TRANSMISSION BLOCKING HOLDER

PRIORITY CLAIM

This application claims priority to and the benefit as a continuation-in-part application of U.S. patent application Ser. No. 12/876,804, entitled "Data Transmission Blocking Holder For Personal Data Transmitting And Receiving Devices", filed Sep. 7, 2010, the entire contents of which are hereby incorporated by reference and relied upon.

BACKGROUND

The present disclosure relates to personal data transmitting and receiving devices, such as cellular phones, and more particularly to enclosures for same.

U.S. Pat. No. 7,601,921 and Publication No. 2003/0057131 disclose electromagnetic interference ("EMI") shielding containers. A need exists for an improved container as addressed by the devices disclosed herein.

SUMMARY

The present disclosure relates to data transfer blocking containers, keepers, housings, holders and protectors (collectively referred to herein as a "holder") for any type of personal communication device ("PCD") such as a cellular phone, electronic mail ("email") device, smart phone, personal computer and any combination thereof. There are many instances in which it is desirable to ensure that a person's PCD does not make a sound or even vibrate. Examples include courtrooms, meeting rooms, movies, plays, talks, seminars, etc. In certain of these examples, e.g., a courtroom or conference room, it is desirable for there to be a common data transfer blocking container, which ensures that everyone complies with the no interruption rule or request. Even people who try to comply with the rule or request can make a mistake that will result in their PCD ringing, vibrating or making some other type of disturbance. The holder of the present disclosure prevents disturbance even in the situation of a mistake.

It is also expressly contemplated to provide an automobile console/dashboard that can integrate or removably or releasably hold any of the signal blocking holders discussed herein. More and more jurisdictions are banning cellular phones from being used inside an automobile. The console/dashboard of the present disclosure provides a convenient way to remove even the temptation of accepting an incoming call or textual message by prohibiting same from occurring inside the automobile.

In one primary embodiment of the present disclosure, the PCD holder is sized to hold a single PCD and is intended to be owned or controlled by an individual. The holder is in one preferred embodiment rigid or semi-rigid, such that the holder also serves to physically protect the user's PCD. The holder can for example be of a generally rectangular shape, wherein one wall of the holder is hingedly, slidingly or otherwise releasably attached to the remainder of the generally rectangular holder.

The rigid or semi-rigid walls can be made of any suitable organic or inorganic material, such as wood, metal, plastic and any combination thereof. The walls in any case are either formed of or have affixed a metal shell that encloses the PCD so that data (e.g., phone, email or text data) cannot be transmitted from or be received by the PCD. In one example, the holder is a metal holder, which is made of any suitable conductive material. Aluminum and copper and alloys thereof are two suitable examples. When the user places the PCD in the holder and closes its lid or door, any incoming calls, emails or texts will be blocked and not received. The blocked data transfer will be stored on the sender's server until the user removes the PCD from the holder, at which time the data transfer will be delivered to the PCD. Until then, the PCD is assured of not ringing, vibrating or otherwise making a disturbance. The metal walls can have a soft inner liner, such as foam or felt, so that the holder also provides drop or impact protection.

In another embodiment, the walls of the holder are made of plastic, epoxy or other polymeric material (referred to herein collectively as "synthetic" or "synthetic material"). The synthetic walls are rigid or semi-rigid and accordingly provide physical protection, including drop or impact protection. The synthetic walls are provided with a coating of conductive material (for example, aluminum, copper and alloys thereof), which can be applied via a suitable process, such as laminating, printing, spraying (e.g., in a conductive liquid form such as a conductive ink), sputtering or via any thin or thick film metallic application.

In still another technique, it is contemplated to impregnate the synthetic polymer with a high enough percent loading of conductive particles to allow the holder to block incoming data. The conductive layer can accordingly be continuous or discontinuous, e.g., granulated, perforated or of a mesh or foil. The conductive layer can be surrounded by the synthetic material, e.g., for corrosion prevention, or be located on the outside or inside surfaces of the walls of the holder.

Still further alternatively, it is contemplated to form a metal shell and to then apply the synthetic material. A metal shell can be formed, for example, from copper. A mandrel in the shape and size of the PCD is placed inside of the metal shell, after which the synthetic material is flowed into the metal shell and around the outside of the mandrel. After the synthetic material is cured, the mandrel is removed, leaving an opening sized and shaped to receive the PCD.

While many of the example holders shown below are rigid or semi-rigid, it is also contemplated to make a soft-shelled holder. An outer flexible shell can be made of a finishing material, such as vinyl, silicone, a fabric or other woven flexible material, such as a trampoline material. A metal, data-blocking shell is located inside the outer shell and can be a thin flexible foil or mesh screen. A foam insert can be located inside the metal shell to provide impact and drop protection. A top of the flexible holder can have a zipper or other releasable fastener to close the holder around the PCD. It is also contemplated to size the soft-shelled holder to be large enough to hold multiple PCD's.

As shown in detail below, the holders can be sized to hold a single PCD or multiple PCD's, e.g., for courtrooms, meeting rooms, auditoriums, hospital areas where sensitive equipment is used and the like. In an embodiment, the multi-compartment holder has an outer surface made of an aesthetically pleasing material, such as stained wood, colored synthetic material or polished metal. If wood or plastic, an inner layer is applied to the walls of the outer surface so as to create a common data blocking cage for each of the PCD's placed in the multi-compartment holder. The multi-compartment holder can have dividers for keeping the multiple PCD's separate from each other. The dividers can be plastic or covered with felt or other fabric to protect the PCD's from scratching. The dividers however do not necessarily have to provide metallic caging.

In one embodiment, the individual compartments of the multi-compartment holder are numbered and provided with a chip or marker bearing the same number. The chip or marker is given to the user who checks his or her PCD into the holder. The user then has to return the chip or marker to retrieve the PCD. This security feature is useful for a courtroom type of environment in which there are attendees that do not know each other. A meeting room or conference room may not need or use this security feature.

As shown in detail below, the single or multi-compartment holders can be formed, stamped or injection or blow molded. It is contemplated expressly to make the holders from a conductive particle injectable rubber or plastic. Also, any of the holders made of any of the materials discussed herein, can be gasketed with an a compressible, signal blocking material, such as a signal blocking rubber. The gasketing helps to mitigate the effects of imperfections in the interfacing between different components of the holder. It is also contemplated to providing openings in the holders to allow the holders to be selectively data signal blocking or data signal receiving. The openings can be advantageously positioned to allow the PCD to be charged while protected within the holder. Also discussed in detail shown below is a repeating circuit that may be provided to selectively enable a signal reaching the holder to be repeated within the holder and delivered to a PCD held within the holder. The repeater also works in the other direction to selectively allow data to be transmitted from the PCD, though the holder, to the outside world.

It is accordingly an advantage of the present disclosure to provide a PCD holder that prevents the PCD from receiving or emitting a data signal.

It is another advantage of the present disclosure to provide a PCD holder that prevents the PCD from ringing, vibrating or causing a disturbance.

It is a further advantage of the present disclosure to provide a PCD holder that prevents the PCD from becoming scratched or nicked.

It is yet another advantage of the present disclosure to provide a PCD holder that provides impact or drop protection.

It is yet a further advantage of the present disclosure to provide a PCD holder that holds multiple PCD's.

It is still another advantage of the present disclosure to provide a PCD holder that is selectively signal blocking or signal receiving.

It is still a further advantage of the present disclosure to provide a PCD holder that enables the PCD to be charged while located within the holder.

Further still, it is an advantage of the present disclosure to provide a PCD holder that enables the PCD to be operated while located within an opened or accessed PCD holder.

Additional features and advantages are described herein, and will be apparent from the following Detailed Description and the figures.

BRIEF DESCRIPTION OF THE FIGURES

FIG. 7 is a perspective view of a further embodiment of a PCD holder of the present disclosure.

FIG. 8 is a perspective view yet another embodiment of a PCD holder of the present disclosure.

FIGS. 11A and 11B are perspective views of another multiple PCD holder embodiment of the present disclosure, wherein FIG. 11B is a sectioned view taken along line XIB-XIB of one embodiment of FIG. 11A.

FIGS. 13A and 13B are perspective views of still another embodiment of a PCD holder of the present disclosure.

FIG. 14 is a perspective view of still a further embodiment of a PCD holder of the present disclosure.

FIG. 17 is a schematic view of one suitable repeating circuit useable with the holder of FIG. 16.

DETAILED DESCRIPTION

Figure 1:
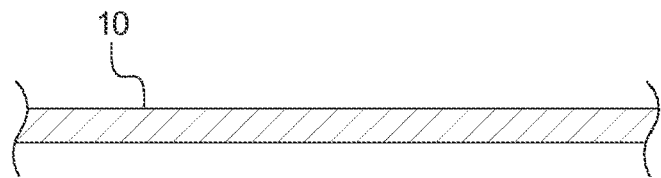
FIG. 1 is a sectioned elevation view of one suitable holder wall material for blocking the transmitting and receiving of a signal at a personal communication device ("PCD").

Example Materials for the PCD's of the Present Disclosure

Referring now to the drawings and in particular to FIGS. 1 to 4, various embodiments of signal blocking, cage providing materials are illustrated. Any of the holders described herein can be made of any of the material configurations shown in FIGS. 1 to 4, alone or in combination with other materials. To that end, each of the material configurations shown in FIGS. 1 to 4 can be sized and configured to be rigid, semi-rigid or flexible.

FIG. 1 shows a first material 10, which is a conductive wall. Suitable metals for material 10 include aluminum, copper and alloys thereof, however, it is contemplated to use other metals, alloys thereof and any material that allows electrons to flow. Conductive wall 10 can be of a single layer or multiple layers of the same or different conductive materials. Conductive wall 10 can be continuous, discontinuous, meshed or perforated. Suitable signal blocking materials include any conductive material. One suitable thickness range for metallic wall 10 is from several thousandths of an inch or less up to 0.250 inch (8 millimeters) or more.

Figure 2:
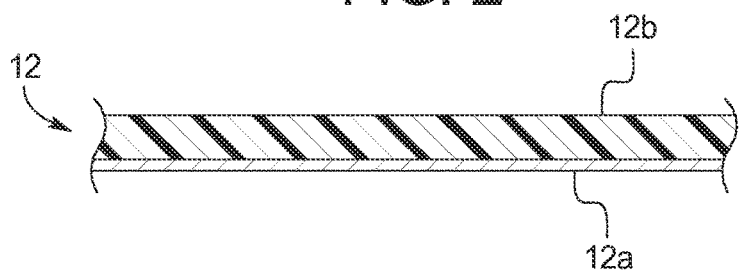
FIG. 2 is a sectioned elevation view of another suitable holder wall material of the present disclosure for blocking the transmitting and receiving of a signal at a PCD.

FIG. 2 shows a second material 12, which includes a conductive layer 12a applied to an electrically insulating layer 12b. Conductive layer 12a can be of any variety discussed above for conductive wall 10. Insulating layer 12b can be of any electrically insulating inorganic material, such as plastic, epoxy or other polymeric material (referred to herein collectively as "synthetic" or "synthetic material"). Insulating layer 12b can alternatively be of any electrically insulating organic material, such as wood.

In one embodiment, conductive layer 12a is laminated, printed, sprayed (e.g., in a conductive liquid form such as a conductive ink), sputtered or applied via any thin or thick film application to preexisting insulating layer 12b. In another embodiment, insulating layer 12b is laminated, printed or sprayed onto preexisting conductive layer 12a. In still another embodiment, conductive layer 12a and insulating layer 12b are both preexisting and are adhered, heat sealed and/or manually pressed together. Material 12 has an overall thickness in one embodiment of up to 0.250 inch (8 millimeters) or more.

Figure 3:
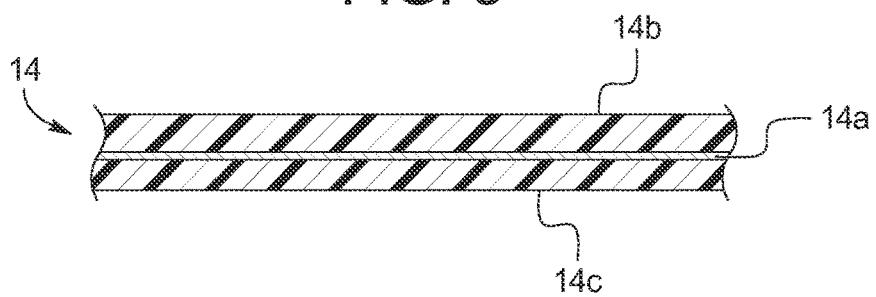
FIG. 3 is a sectioned elevation view of a further suitable holder wall material of the present disclosure for blocking the transmitting and receiving of a signal at a PCD.

FIG. 3 shows a third material 14, which includes a conductive layer 14a surrounded by two electrically insulating layers 14b and 14c. Conductive layer 14a can be of any variety discussed above for conductive wall 10. Insulating layers 14b and 14c can be of any variety discussed above for insulating layer 12b and can be the same as each other or of different varieties. Conductive layer 14a and either of insulating layers 14b and 14c are formed together via any of the methods discussed above for material 12. The second one of the insulating layers 14c or 14b is then applied to the open surface of conductive layer 14a via any of the methods discussed above for applying insulating layer 12b to conductive layer 12a, including the situation in which second insulating layer is a preexisting layer that at is adhered, heat sealed and/or press-fitted to the open surface of conductive layer 14a. In an alternative embodiment, it is contemplated to form the three layers 14a, 14b, and 14c together in an extrusion process. Material 14 has an overall thickness in one embodiment of up to 0.250 inch (8 millimeters) or more.

It is also contemplated for material 14 to include multiple conductive layers such as, conductive layer 14a coupled to a single insulating layer, such as insulating layers 14b and 14c. It is further contemplated for material 14 to include multiple conductive layers, such as, conductive layer 14a coupled to a multiple insulating layers, such as insulating layers 14b and 14c. For example, two conductive layers could be sandwiched between three insulating layers. Any combination of even or odd conductive layers could be coupled to any combination of even and odd insulating layers. In still another alternative embodiment, multiple conductive layers, such as multiple ones of conductive layer 14a can be coupled together without any insulating layer. The multiple conductive layers can be of the same conductive material or of different materials. The multiple conductive layers can each be continuous or discontinuous, for example, a copper mesh coupled to an aluminum mesh.

Figure 4:
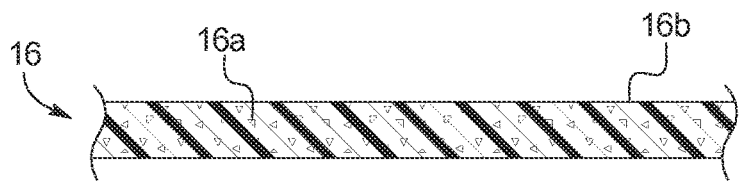
FIG. 4 is a sectioned elevation view of yet another suitable holder wall material of the present disclosure for blocking the transmitting and receiving of a signal at a PCD.

FIG. 4 shows a fourth material 16, which includes many conductive particles 16a impregnated into a polymeric, resin, rubber, or otherwise synthetic base material 16b. Conductive particles 16a can be made of any material discussed above for conductive wall 10. Conductive particles 16a are loaded at a percentage within synthetic base 16b that is sufficient to provide a signal blocking, cage producing quality to material 16. Material 16 has a thickness in one embodiment of up to 0.250 inch (8 millimeters) or more. Suitable conductively loaded or shield-providing rigid or semi-rigid materials 16 are made by Ecomass Technologies, 4101 Parkstone Heights Dr., Suite 380, Austin, Tex. 78746-7482, USA, which makes thermoplastic compounds that are nontoxic, high density, and which can be formulated to have a density up to the density of lead. The materials are advantageous in one respect because they can be blow or injection molded. Suitable materials include conductively filled acrylonitrile butadiene styrenes ("ABS"), polyether block amides ("PEBA"), polyamide alloys (PA Alloys), polyamide 12 ("PA 12"), polyamide 6 ("PA6"), polyamide 6/10 ("PA6/10"), polyamide 6/6 ("PA6/6"), high density polyethylene ("HDPE"), thermoplastic polyurethanes ("TPU"), and styrene ethylene butylene styrene block copolymer ("SEBS"). The materials can be filled with any one or more conductive material, such as tungsten, copper or stainless steel.

In one embodiment, fourth material 16 is an impregnated rubber, such as a rubber impregnated with metal coated spheres, e.g., glass or graphite spheres coated with nickel or silver, silicone spheres coated with metal, solid metal spheres, metal flakes, metal particles, metal threads and any combination thereof. The impregnated rubber can be used for the holders themselves or for gasketing used to line the holders. The signal blocking rubber material is advantageous because it can be blow or injection molded and provides good shock and impact resistance.

The gasketing discussed in more detail below can also be, for example, fabric over foam, knitted mesh, finger strips, conductive felt, oriented wire shielding, conductive rubber, conductive foam, or foil over foam. Suitable signal blocking gasketing materials may be provided for example by Holland Shielding Systems B.V., Postbus 730, 3300 AS Dordrecht, The Netherlands.

Example PCD's of the Present Disclosure

Figure 5:
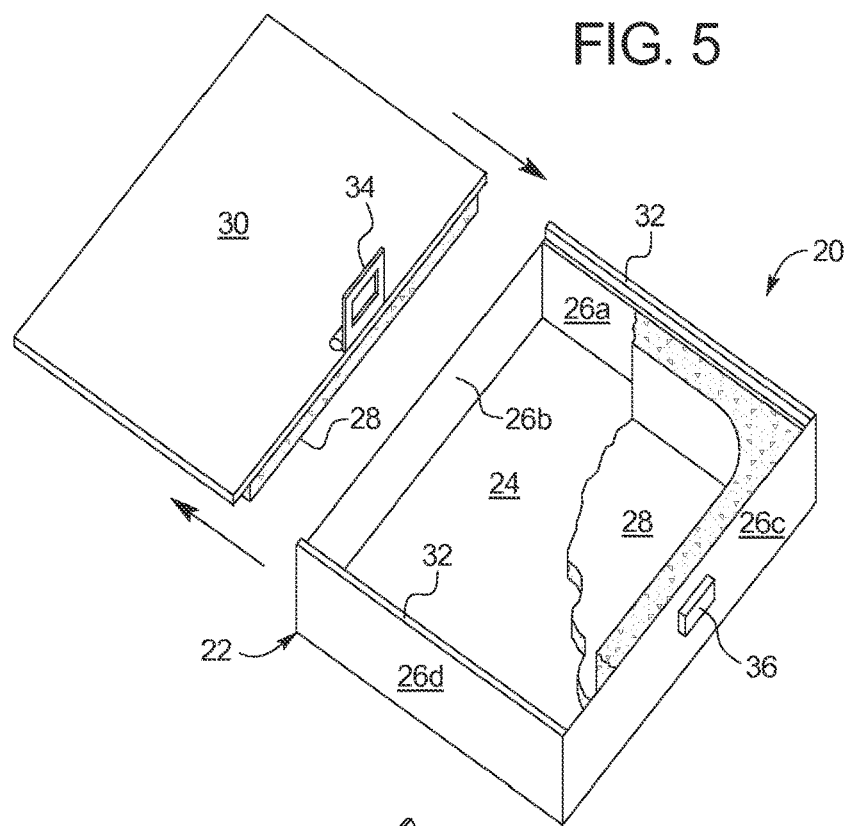
FIG. 5 is a perspective view of one embodiment of a PCD holder of the present disclosure.

Referring now to FIG. 5, a first embodiment of a signal blocking, cage providing personal communication device ("PCD") holder of the present disclosure is illustrated by sliding door holder 20. Holder 20 includes an open-walled housing 22, which includes base wall 24 and side walls 26a to 26d connected together to form a compartment for receiving a PCD. As mentioned above, walls 24 and 26a to 26d can be made of any of material configurations 10, 12, 14 and 16. It should also be appreciated that while holder 20 and the holders shown herein include multiple side walls, it is contemplated to provide an ovular or elliptical housing 12, which would have only a single side wall. In the illustrated embodiment, housing 22 is fitted with a foam or otherwise soft insert 28, which provides additional scratch resistance and drop/impact protection to holder 20. A foam or otherwise soft insert, such as insert 28, can be provided for any of the holders discussed herein.

Top wall 30 (which includes a mating portion of insert 28) is likewise made of any of material configurations 10, 12, 14 and 16 and can be the same or of a different material as housing 22. Top wall 30 in the illustrated embodiment is completely removable from housing 22 and slidingly engages housing 22 for closing and opening holder 20. In the illustrated embodiment side walls 26a and 26d each include a grooved slot 32 that is sized to snugly receive the upper and lower edges, respectively, of top wall 30. The height of front receiving side wall 26b extends to just below grooved slots 32. The height of rear receiving side wall 26c extends to the top of grooved slots 32, and has the same height as side walls 26a and 26d. Such arrangement enables holder 20 to at least virtually completely close around the user's PCD.

Top wall 30 includes or provides a hinged clip 34 that secures releasably to a catch 36 provided on wall 26c. After the user slides top wall 30 through grooved slots 32 all the way so that the leading edge of top wall 30 abuts against wall 26c, the user rotates clip 34 so that it locks to catch 36, which holds top wall 30 securely to housing 22. At this point, the user's PCD is enclosed within the metallic cage of holder 20 and cannot send or receive data signals, such as cellular phone, email, or text signals. Any data that is intended to be sent to the PCB is instead stored at the sending server until top wall 30 is removed and the PCB is activated for data retrieval.

Figure 6:
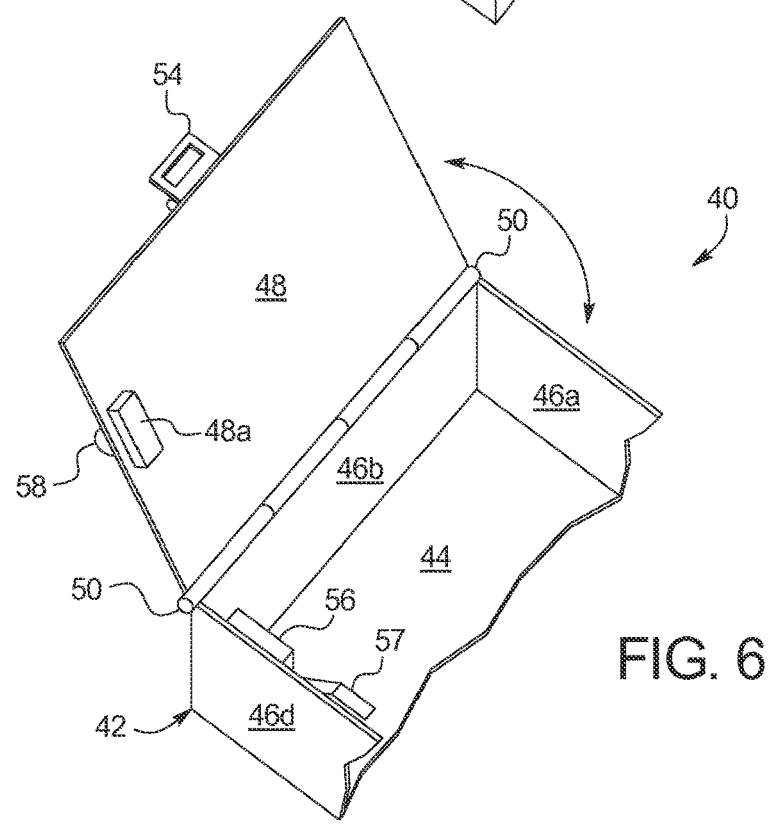
FIG. 6 is a perspective view of another embodiment of a PCD holder of the present disclosure.

Referring now to FIG. 6, a second embodiment of a signal blocking, cage providing PCD holder of the present disclosure is illustrated by hinged door holder 40. Holder 40 includes an open-walled housing 42, which includes base wall 44 and side walls 46a to 46d connected together to form a compartment for receiving a PCD. Walls 44 and 46a to 46d can be made of any of material configurations 10, 12, 14 and 16 discussed above. As with holder 20, housing 42 of holder 40 can be fitted with a foam or otherwise soft insert, such as insert 28 above, which provides additional scratch resistance and drop/impact protection to holder 40.

Hinged top wall 48 (which can include a mating portion of insert 28) is likewise made of any of material configurations 10, 12, 14 and 16 and can be the same or of a different material as housing 42. Hinged top wall 30 in the illustrated embodiment is hinged to housing 42 via a hinge 50, which can be any suitable hinge such as a piano hinge or a living hinge. In the illustrated embodiment, side walls 26a to 26d are each of the same height, such that holder 40 can at least virtually completely close around the user's PCD.

Hinged top wall 40 includes or provides a hinged clip 54 that secures releasably to a catch provided on the wall cutaway in FIG. 6 (which would be wall 46c analogous to wall 26c of holder 20). After the user rotates top wall 48 about hinge 50 all the way so that top wall 48 closes onto housing 42, the user rotates clip 54 so that it locks to the catch, which holds top wall 48 securely to housing 42. At this point, again, the user's PCD is enclosed within the metallic cage of holder 40 and cannot send or receive data signals, such as cellular phone, email, or text signals. Any data that is intended to be sent to the PCB is instead stored at the sending server until top wall 48 is rotated open about hinge 50 and the PCB is activated for data retrieval.

FIG. 6 also illustrates a feature that may be used with any of the PCD holders described herein, namely, a light emitting diode ("LED") or other type of illumination source that is illuminated when the PCD holder is closed and data signal blocking. In the illustrated embodiment, housing 42 is provided with an area to receive a rechargeable or non-rechargeable battery 56, such as a lithium, nickel-based or zinc-based battery. Multiple batteries 56 could be required. Battery 56 in an embodiment can be solar powered. In still a further alternative embodiment, illumination source 58 is powered by the PCD.

In the illustrated embodiment, power source or battery 56 is connected to a spring-loaded switch 57. Top wall 48 or lid 48 is provided with a projection 48a that maters with a contact end of spring-loaded switch 57 when top wall 48 or lid 48 is closed onto housing 42. Projection 48a causes the contact end of spring-loaded switch 57 to bend or rotate against the spring bias of spring-loaded switch 57, making an electrical contact within the switch. The making of the electrical contact causes illumination source 58 to illuminate, indicating that PCD holder 40 (or any of the holders discussed herein) is closed and data signal blocking. When top wall 48 or lid 48 is rotated away from housing 42, projection 48a releases from the contact end of spring-loaded switch 57, such that the spring bias of spring-loaded switch 57 causes the internal contact of switch 57 to become unmade and the illumination source to no longer illuminate. At this point, the user should expect their PCD to be able to send and receive data.

It should be readily apparent to those of skill in the art as to how power source or battery 56, switch 57 and illumination source 58, or similar structure could be modified for the sliding lid arrangement of FIG. 5, the sliding housings arrangement of FIG. 7, and the translating lid arrangement of FIG. 8. The hinged lid of the multi-compartment holder of FIG. 10 is very similar to that of FIG. 6. One or more LED's 58 can be illuminated to indicate that the multi-compartment holder of FIG. 10 is in a data signal blocking state. To that end, each holder of the present disclosure can use one or more LED's 58. The flexible arrangement of FIG. 9 could make electrical, illumination starting contact upon the full closing of its zipper or releasable elongated clasp.

Referring now to FIG. 7, a third embodiment of a signal blocking, cage providing PCD holder of the present disclosure is illustrated by holder 60. Holder 60 includes an open-walled housing 62, which includes base wall 64 and side walls 66a to 66d connected together to form a compartment for receiving a PCD. Walls 64 and 66a to 66d in one embodiment are formed as a single injection molded synthetic housing 62. Housing 62 is alternatively a soft or hard foam piece with the PCD shape cut or stamped out of the housing. Walls 64 and 66a to 66d in one embodiment have no metallic component and are not signal blocking. A signal blocking wall 68, which can be made of any of material configurations 10, 12, 14 and 16 discussed above is applied to, e.g., laminated to side wall 66d. Housing 62 of holder 60, being made of a synthetic or foam material, provides scratch resistance and drop/impact protection to holder 60.

Housing 62 is sized to slide snuggly into outer housing 70. Outer housing 70 includes a top wall 72, a base wall 74 and three side walls 76a to 76c, leaving an opening for receiving PCD carrying housing 62. Each of top wall 72, base wall 74 and side walls 76a to 76c is, like wall 68, signal blocking and made of any of material configurations 10, 12, 14 and 16 discussed above. Walls 66b and 66c of inner housing 62 are formed or provided with projections/detents 78a that snap-fittingly mate with detents/projection 78b formed or provided with walls 76b and 76c of outer housing 70 when inner housing 62 has been fully slid into outer housing 70. Projections/detents 78a and 78b releasably secure inner housing 62 inside of outer housing 70. A finger tab 68a or other suitable device is formed or provided with signal blocking wall 68 to aid the user in pulling inner housing 62 from outer housing 70 to retrieve the user's PCD.

When inner housing 62 is fully inserted into outer housing 70, holder 60 at least virtually completely closes around the user's PCD. At this point, again, the user's PCD is enclosed within the metallic cage of holder 60 and cannot send or receive data signals, such as cellular phone, email, or text signals. Any data that is intended to be sent to the PCB is instead stored at the sending server until top wall 48 is rotated open about hinge 60 and the PCB is activated for data retrieval.

In an alternative version of holder 60, walls 66a to 66d of housing 62 and top wall 72 of outer housing 70 are signal blocking, while the remaining walls of outer housing are not signal blocking. In this configuration, top wall 72 can be provided with indicia and/or projections/detents 78a and 78b can be structured so that signal blocking top wall 72 is ensured to be slid over the PCD cutout of housing 62 (as opposed to the non-signal blocking wall 74). In a further alternative version of holder 60, walls 66*a* to 66*d* of inner housing 62 and walls 72 and 74 of outer housing 70 are both signal blocking walls, making proper insertion of inner housing 62 into outer housing 70 mistake proof.

Referring now to FIG. 8, a fourth embodiment of a signal blocking, cage providing PCD holder of the present disclosure is illustrated by translating door holder 80. Holder 80 includes an open-walled housing 82, which includes base wall 84 and side walls 86*a* to 86*d* connected together to form a compartment for receiving a PCD 90. Walls 84 and 86*a* to 86*d* are signal blocking and are made of any of material configurations 10, 12, 14 and 16 discussed above. As with holder 20, housing 82 of holder 80 can be fitted with a foam or otherwise soft insert, such as insert 28 above, which provides additional scratch resistance and drop/ impact protection to holder 80. In one embodiment, housing 82 is made by constructing walls 84 and 86*a* to 86*d*, after which a mandrel is inserted into walls 84 and 86*a* to 86*d*. The mandrel has the shape of the PCD 90. Next, a synthetic, foam, sponge or other softer protective material 94 is sprayed, poured or otherwise flowed or placed inside walls 84 and 86*a* to 86*d* and around the mandrel. Once the protective material is cured or stabilized, the mandrel is removed, leaving an opening in the shape of, or larger than shape of PCD 90.

A top signal blocking wall 88 in the illustrated embodiment is configured to translate onto housing 82 and is sized to releasably but securely press-fit to housing 82. Top wall 88 is made of any of material configurations 10, 12, 14 and 16 discussed above. A knob, tab or other protrusion 92 is formed or provided with top wall 88 to aid the user in attaching and removing top wall 88 from housing 82. Top wall 88 can also include a foam or impact resisting material 94 on its underside. Top wall 88 can alternatively slide onto (e.g., like FIG. 5) or hinge to (e.g., like FIG. 6) housing 82.

When top wall 88 is secured to housing 82, holder 80 at least virtually completely closes around PCD 90. At this point, PCD 90 is enclosed within the metallic cage of holder 80 and cannot send or receive data signals, such as cellular phone, email, or text signals. Any data that is intended to be sent to the PCD is instead stored at the sending server until top wall 88 and PCD 90 are removed and the PCD is activated for data retrieval.

Figure 9:
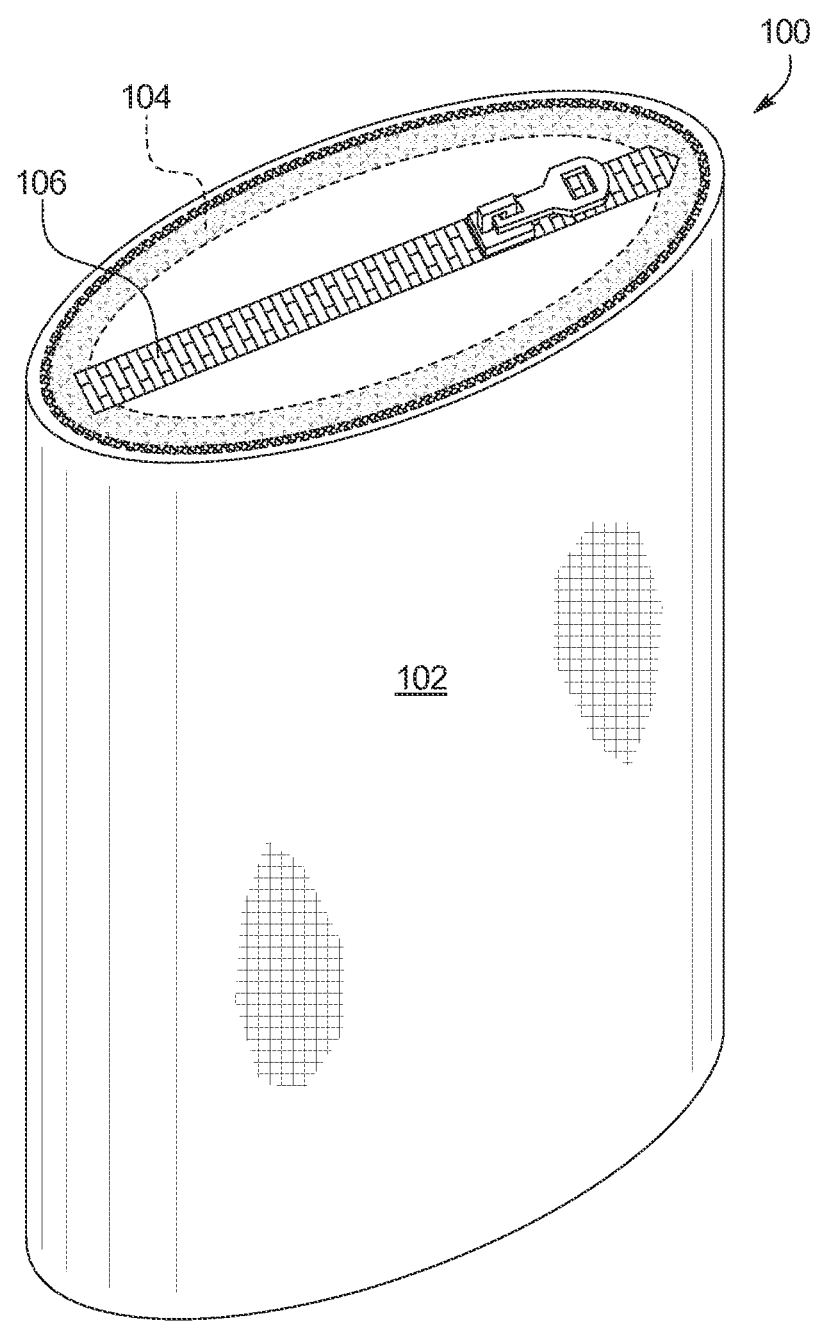
FIG. 9 is a perspective view one flexible PCD holder embodiment of the present disclosure.
Figure 10:
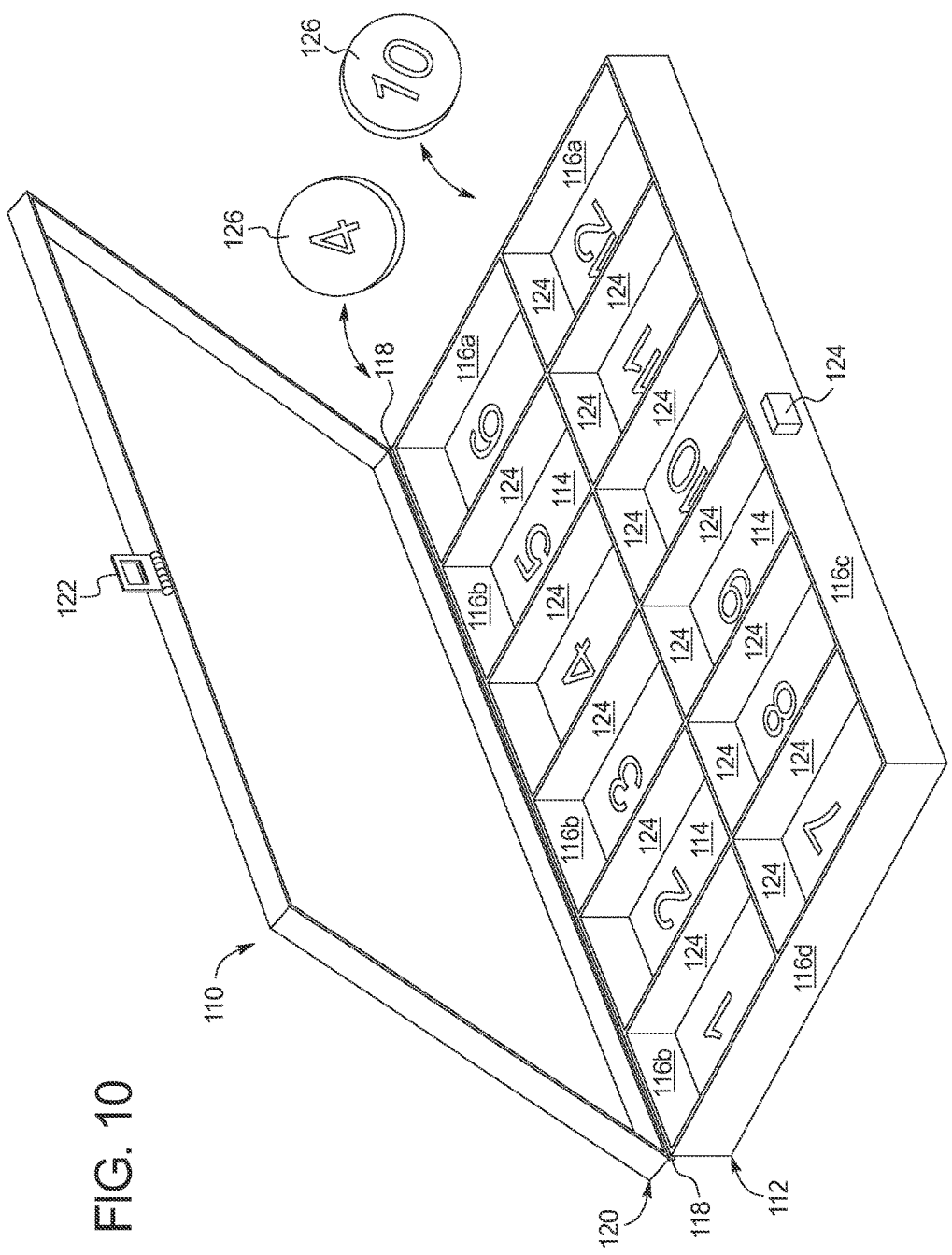
FIG. 10 is a perspective view one multiple PCD holder embodiment of the present disclosure.

Referring now to FIG. 9, one embodiment of a flexible holder is illustrated by holder 100. Flexible holder 100 is made of a flexible outer jacket 102, which can include any of the material configurations 10, 12, 14 and 16 discussed above. The outer surface of jacket 102 can have a vinyl, leather, cloth or other woven, mesh or trampoline surface, which is aesthetically pleasing. A foam, soft or sponge material 104 is placed inside jacket 102. Jacket 102 is also provides with a zipper 106 or other releasably securable device, which allows the user's PCD to be inserted and removed from holder 100.

Holder 100 completely closes around the user's PCD. At this point, again, the PCD is enclosed within the metallic cage of holder 100 and cannot send or receive data signals, such as cellular phone, email, or text signals. Any data that is intended to be sent to the PCD is instead stored at the sending server until the PCD is removed and activated for data retrieval.

Referring now to FIG. 10, one embodiment of a multi-compartment holder is illustrated by holder 110. Holder 110 includes a multi-compartment housing 112 having a common signal blocking lower wall 114 and common signal blocking side walls 116*a* to 116*d*. Each of lower wall 114 and common side walls 116*a* to 116*d* can be made of any of the signal blocking material configurations 10, 12, 14 and 16 discussed above.

A signal blocking lid 120 is shown hinged via hinge 118 (e.g., piano or living) to housing 112 but can alternatively, slide onto, fit over or press-fit onto housing 112 as has been shown herein. Signal blocking lid 120 can be made of any of the signal blocking material configurations 10, 12, 14 and 16 discussed above. Lid 120 includes one or more hinged locking tab 122 that releasably locks to catch 124 located on side wall 116*c* of housing 112 when lid is closed onto housing 112.

A non-signal blocking separator 124 is located inside housing 112. Separator 124 divides the space inside housing 112 into multiple individual PCD receiving compartments, here twelve compartments. In the illustrated embodiment, each compartment is given unique marking, number, image or indicium. A chip or marker 126 bearing a like marking, number, image or indicium is provided for each compartment. When multiple users place their PCD's into the compartments of multi-compartment holder 110, each user obtains the compartment's corresponding chip or marker 126. To ensure that the user retrieves the proper PCD from multi-compartment holder 110, the chip or marker 126 has to be returned to its compartment so that the PCD it currently houses can be returned to the proper owner.

In alternative multi-compartment holder embodiments, markers 126 and corresponding indicia are not provided. It is also contemplated to not provide separator 124. It should be appreciated that removing separator 124 allows enough space to place a user's personal computer, e.g., laptop or touch screen based computer. In another example, flexible holder 100 of FIG. 9 can be sized to hold multiple PCD's, e.g., without a separator. In any case, multi-compartment holder 100 completely closes around the users' PCD's. The PCD's are collectively enclosed within the metallic cage of holder 110 and cannot send or receive data signals, such as cellular phone, email, or text signals. Any data that is intended to be sent to any of the PCD is instead stored at the sending server until the corresponding PCD is removed and activated for data retrieval.

It should be appreciated that multi-compartment holder 110 does not need to be as mobile as the individual holders. Indeed, it may be desirable to bolt or otherwise make multi-compartment holder 110 generally immovable, for example, to prevent the multiple PCD's placed into multi-compartment holder 110 from getting jumbled or intermixed. This is desirable for the protection of the PCD's and the specific location security discussed above with markers 126. It is accordingly expressly contemplated to build multi-compartment holder 110 as a larger piece of furniture or structure, such as part of a cabinet, desk, panel, lectern or table. For example, many conference room tables are provided with imbedded, e.g., tabletop, drawers or holding areas supplying internet access ports and/or power plugs. One or more of the drawers or holding areas could be made to be data signal blocking via any of the materials and structural configurations discussed herein.

Referring now to FIGS. 11A and 11B, another embodiment of a multi-compartment holder is illustrated by holder 140. Holder 140 includes a multi-compartment housing 142 having a common signal blocking lower wall 144 and common signal blocking side walls 146*a* to 146*d*. Each of lower wall 144 and common side wall 146*a* to 146*d* can be made of any of the signal blocking material configurations 10, 12, 14 and 16 discussed above.

A signal blocking lid 150 is shown hinged via hinge 148 (e.g., piano or living) to housing 142 but can alternatively, slide onto, fit over or press-fit onto housing 142 as has been shown herein. Signal blocking lid 150 can be made of any or the signal blocking material configurations 10, 12, 14 and 16 discussed above. In the illustrated embodiment, the underside of signal blocking lid 150 is fitted with a window or mirror 152. If a mirror 152, the material above or on the outside of the mirror can be made of one of the signal blocking material configurations 10, 12, 14 and 16. If a window 152, which is at least partially uncovered on both sides so that user(s) can look into multi-compartment holder, the window in one embodiment is made of a radio frequency ("RF") shielded glass or clear (transparent or highly translucent) RF shielded plastic. Window 152 could for example be clear acrylic with an imbedded or attached mesh screen. Other suitable shielded window materials may be provided by (i) East Coast Shielding, 37 RT 46 Hackettstown N.J., 07840 USA, telephone: (908) 852-9160, facsimile: (908) 852-9163 or (ii) Shielding Express Inc., 29 Mozzone Blvd., Taunton, Mass. 02780 USA, telephone: (508) 880-0987, facsimile: (508) 880-0334.

A non-signal blocking separator 154 is located inside housing 142. Separator 154 here divides housing 142 of multi-compartment holder 140 into upper and lower levels. The lower level is left generally open underneath separator 154 to receive one or more larger PCD 90, such as an iPad™ or other larger wireless communication device. The upper level is supported by the top side of separator 154, which can include, provide or be fitted with grooves or tracks to receive multiple smaller PCD's 90 as illustrated in FIG. 11A. When signal blocking lid 150 is flipped over onto housing 142, covering separator 154, all data transmission to and from each of the PCD's 90 placed in holder 140 is blocked.

FIG. 11B illustrates a cross-section of one embodiment of multi-compartment holder 140 illustrated in FIG. 11A. Separator 154 has been removed to enhance the illustration. In the illustrated embodiment, housing 142 includes lower wall 144 and side walls 146a to 146d, which can be made of wood, such as an aesthetically pleasing and high grade wood, e.g., cherry or mahogany. The wood exterior is well-suited for office conference rooms, offices, courtrooms and the like. A signal blocking, e.g., metal, frame 160 is placed in wood housing 142. Metal frame 160 is generally five-sided in one embodiment and open at the top. Metal frame 160 can be made or any suitable metal discussed herein and is stamped in one embodiment. A matching or mating fabric, e.g., felt or otherwise soft material layer 156, is placed above metal frame 160 to provide an aesthetically pleasing and protective surface for receiving a PCD 90. The fabric is the same fabric used to line the separator 154 received within housing 142 in one embodiment.

FIG. 11B illustrates that the top of metal frame 160 provides a gasket holding flange 162, which in one embodiment extends around the entire perimeter of the top of metal frame 160. Gasket holding flange 162 holds in place a gasket 164, which in an embodiment is likewise of a shielding or blocking material, such as any of the materials discussed above in connection with material 16 and FIG. 4. Gasket 164 provides a soft, cushioned interface between housing 142 and lid 150 and also helps to ensure that no data transmission can slip into or out of any non-uniform or non-contacting area of the interface between the housing and the lid.

In the specific implementation of FIG. 11B, lid 150 includes a mirror 152 located beneath the outer wooden surface. Mirror 152 in an embodiment is covered by or coated with, e.g., adhered to, a clear, thin plastic RF shielding sheet that mates with gasket 164 to complete the shielded box. For example, a 9800 ESD provided by Holland Shielding mentioned above is a transparent static dissipative, self-adhesive polyester film. The material includes a specialized coating on one side and a release film on the other side. The material can be applied to mirror 152 (on one or both of the mirror's upper and lower surfaces) to cause the mirror to be signal blocking, while still serving as a reflective mirror. Alternatively, any of the materials 10, 12, 14 or 16 can be placed between the mirror 152 and the upper wooden surface. Mirror 152 in this latter situation can then be reduced in size to allow the material 10, 12, 14 or 16 to contact gasket 164 to complete the shielded box. Further alternatively, a window 152 is provided, which is RF shielding as has been described herein. Window 152 could alternatively be standard glass with a layer of the 9800 ESD Film™ adhered to one or both of its surfaces. Window 152 is exposed on both sides to allow users to see into multi-compartment holder 140.

Figure 12A:
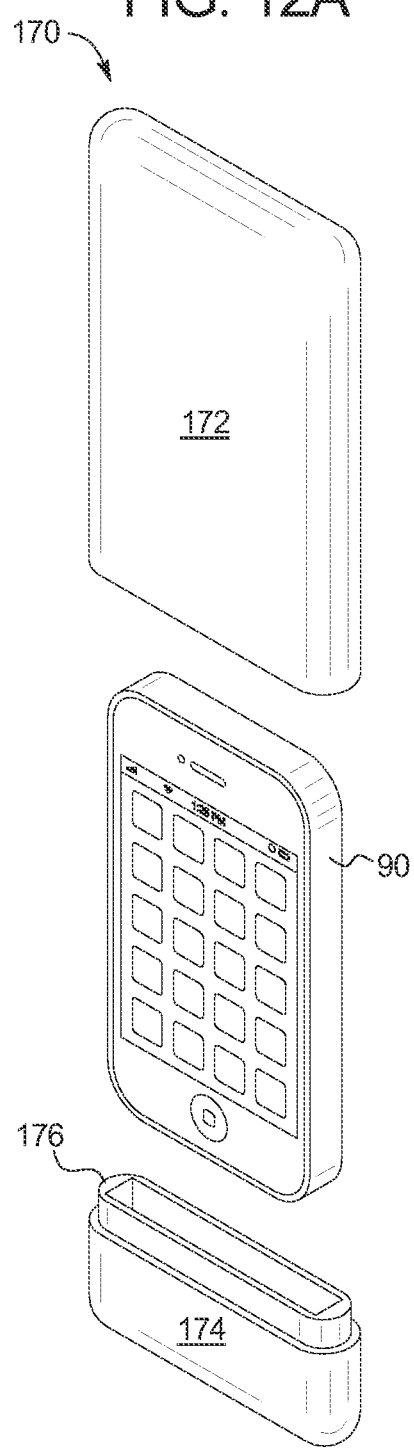
FIGS. 12A and 12B are perspective views of yet a further embodiment of a PCD holder of the present disclosure.
Figure 12B:
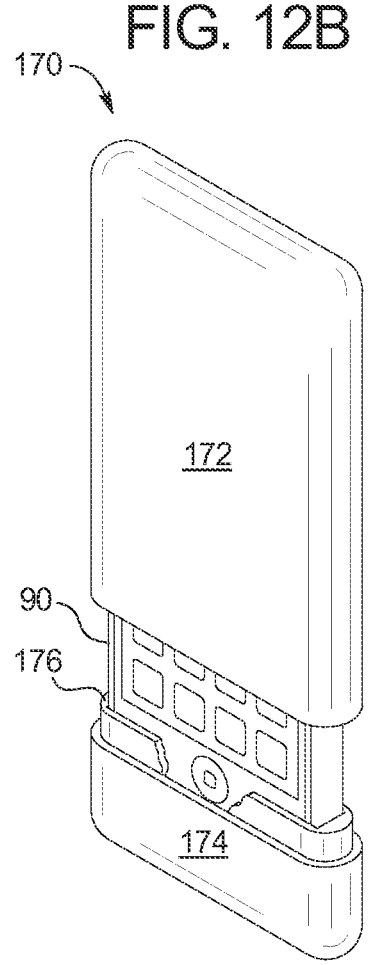

Referring now to FIGS. 12A and 12B, holder 170 illustrates another single PCD 90 holder of the present disclosure. Holder 170 includes an upper housing portion 172 and a lower housing portion 174, which are each generally five-sided and open on one end to meet one another to form an enclosure that fits around PCD 90. The enclosure (as with any of the single enclosures discussed herein) can be sized and fitted for a particular brand, style, class or size of PCD 90 or can be sized generally to fit multiple brands, styles, classes or sizes of PCD's 90.

Upper housing portion 172 and lower housing portion 174 can be made of any of the materials 10, 12, 14 or 16 discussed herein. For example, upper housing portion 172 and lower housing portion 174 can each be stamped stainless steel. Alternatively, upper housing portion 172 and lower housing portion 174 are each blow or injected molded from one of the RF shielding polymers or rubbers discussed above. Housings 172 and 174 can be made of the same or different ones of the signal shielding materials discussed herein.

Lower housing portion 174 is fitted with, e.g., adhered to, a gasket 176 (cutaway in FIG. 12B for illustration purposes), which can be made of any of the gasketing materials discussed above with material 16 of FIG. 4. Gasket 176 sealingly or press-fittingly mates with the lower end of upper housing portion 172. Gasket 176 provides a soft, cushioned interface between housing portions 172 and 174 and also helps to ensure that no data transmission can slip into or out of any non-uniform or non-contacting area of the interface between the housing portions when mated. Gasket 176 also helps to hold housing portions 172 and 174 releasably together.

As should be readily apparent from FIGS. 12A and 12B, mated housing portions 172 and 174 provide a sleek, rounded encasement for PCD 90, which provides both physical and radio transmission protection. Housing portions 172 and 174 can be provided with any of the internal foam or padding discussed herein for additional impact resistance and protection.

Referring now to FIGS. 13A and 13B, holder 190 illustrates yet another single PCD 90 holder of the present disclosure. Holder 190 includes a front housing portion 192 and a rear housing portion 194, which are each open on two faces to meet one another to form an enclosure that fits around PCD 90. The enclosure (as with any of the single enclosures discussed herein) can be sized and fitted for a particular brand, style, class or size of PCD 90 or can be sized generally to fit multiple brands, styles, classes or sizes of PCD's 90.

Front housing portion 192 and rear housing portion 194 can be made of any of the materials 10, 12, 14 or 16 discussed herein. For example, front housing portion 192 and rear housing portion 194 can each be stamped stainless steel. Alternatively, front housing portion 192 and rear housing portion 194 are each blow or injected molded from one of the RF shielding polymers or rubbers discussed above. As opposed to holder 170, in which the two housing portions a pulled away from each other to accept PCD 90, front housing portion 192 and rear housing portion 194 slide along each other to accept PCD 90. It is contemplated to allow front housing portion 192 to slide upwardly with respect to rear housing portion 194 so as to be able to accept PCD 90 but still hold portions 192 and 194 together slidingly so that one of portions 192 and 194 cannot become lost or unattached with respect to the other.

Rear housing portion 194 is fitted with, e.g., adhered to, a gasket 196 (cutaway in FIG. 12B for illustration purposes), which can be made of any of the gasketing materials discussed above with material 16 of FIG. 4. In an embodiment, rear housing portion 194 is provided with a groove or grooves into which gasket 196 is fitted. The groove or grooves and associated gasket(s) can extend along both sides and the top of rear housing portion 194, so that the entire interface between portions 192 and 194 can be completely sealed (airtight and data transmission tight) along the three sides. Or, some or all of the gasketing is located on front housing portion 192, as discussed below for example with gasket 198.

Gasket 196 sealingly or press-fittingly mates with the mating surfaces of front housing portion 192. In an embodiment, the sides of front housing portion 192 are provided with elongated tongues that fit into the gasketed grooves 196 along the sides of rear housing portion 194. The tongue and groove interface guides the relative sliding movement of housing portions 192 and 194 and helps to ensure good contact with gasket 196.

In the illustrated embodiment, an additional RF shielding gasket 198 is placed on the lower edge of front housing portion 192. When front housing portion 192 is snapped into place with rear housing portion 194, gasket 198 is compressed between the housing portions, helping to complete the full seal around the periphery of the interface between housing portions 192 and 194. It should be appreciated that for any of the gasketed holders described herein (single and multiple compartment), the gasket (and associated groove and tongue) can be fitted to one or both of the mating housing portions.

Gaskets 196 and 198 provide a soft, cushioned interface between housing portions 192 and 194 and also help to ensure that no data transmission can slip into or out of any non-uniform or non-contacting area of the interface between the housing portions when mated. It should likewise be apparent from FIGS. 13A and 13B that mated housing portions 192 and 194 present a sleek and sturdy encasement for PCD 90, providing both physical and radio transmission protection. Housing portions 192 and 194 can likewise be provided with any of the internal foam or padding discussed herein for additional impact resistance.

Referring now to FIG. 14, holder 210 illustrates yet another single PCD 90 holder of the present disclosure. Holder 210 includes two liked-shaped housing portions 212 and 214. Housing portions 212 and 214 are each long enough to cover at least most of PCD 90. In an embodiment, inner housing portion 212 extends all the way into outer housing portion 214, such that a gasketed end 216 of inner housing portion 212 compresses against an inside surface of the capped end of outer housing portion 214. Gasket 216 is alternatively an o-ring or band that extends around inner housing portion 212, e.g., in a groove or band acceptor, located near the capped end of inner housing portion 212.

Housing portions 212 and 214 can have mating projections/detents, like those discussed above with FIG. 7, to hold the housing portions removably together. Holder 210 can be configured such that the capped end of inner housing portion 212 extends out of outer housing portion 214 a distance sufficient for the user to grasp and pull inner housing portion 212 out from outer housing portion 214. Holder 210 can be made from any of the materials 10, 12, 14 or 16 discussed herein, including any of the metal, plastic or rubber embodiments. Housing portions 212 and 214 can be stamped or molded as desired and when fitted together provide the impact and signal blocking protection discussed herein.

Figure 15:
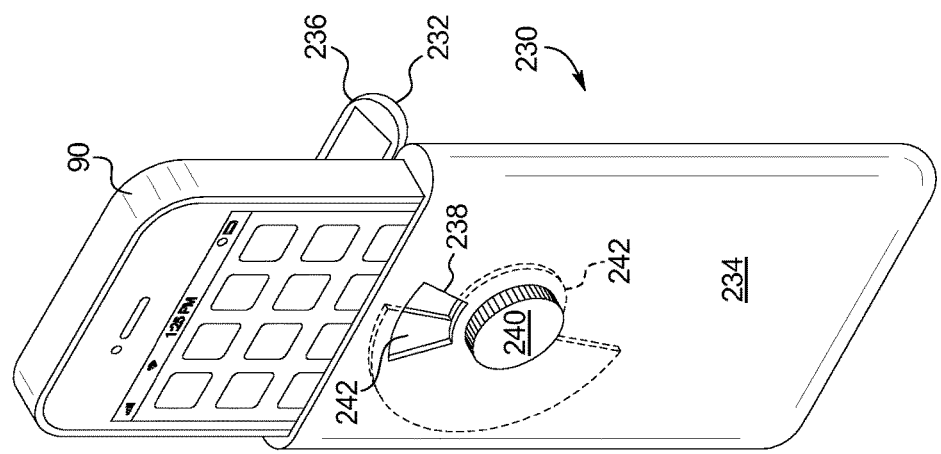
FIG. 15 is a perspective view of one embodiment of a PCD holder of the present disclosure having an adjustable opening to selectively allow for data transmission.

Referring now to FIG. 15, holder 230 illustrates yet another single PCD 90 holder of the present disclosure. Holder 230 includes a lower housing 234 capped by an upper lid 232, e.g., via a hinge such as a living hinge. The housing or the lid can be provided with a gasket 236 using any of the gasketing materials discussed herein. Tongue and groove gasketing can be provided if desired. Although not illustrated, holder 230 can include a snap-fitting apparatus, hook or latch to allow holder 230 to be releasably locked in a closed position. Holder 230 can be made of any of the materials and by any of the processes discussed herein.

Lower housing 234 includes an opening 238 and a dial 240. Dial 240 includes a shaft (not illustrated) that extends through to the inside of housing 234. The shaft is connected to a member 242 located within lower housing 234, such that turning dial or knob 240 likewise turns a member 242 inside lower housing 234. The outer facing surface of member 242 is provided with a signal blocking gasket (using any of the materials discussed herein) in an embodiment, such that the gasket completely surrounds and seals a shaft-receiving aperture (not illustrated) formed in lower housing 234. The gasket also seals member 242 around the entire periphery of opening 238 when dial 240 is turned such that member 242 covers the opening 238 completely. The gasket further serves to hold dial 240 and member 242 in a set position frictionally until the user turns dial 240. End of travel stops to stop member 242 at opened and closed end of travel positions can be provided on the inside of lower housing 234 if desired.

As illustrated in FIG. 15, member 242 is structured to selectively allow opening 238 to provide data transmission access between PCD 90 located within holder 230 and the outside world. That is, dial 240 can be rotated such that PCD 90 is able to receive and transmit signals and data. To that end, dial 240 and opening 238 can be located near an antenna or transmit/receive area of PCD 90 when inserted into holder 230 to encourage the transmission of data when holder 230 is opened via dial 240, member 242 and opening 238. Dial 240, member 242 and opening 238 allow the user to dump data to and/or from PCD 90 at a time desirable to the user without having to remove PCD 90 from its protective case. It is accordingly contemplated to provide dial 240, member 242 and opening 238 (or like structures) with any of the PCD's discussed herein (single or multi-compartment).

When member 242 is moved to close off opening 238 from the inside of holder 230, holder 230 is completely data signal blocking. Alternatively, the placement of lid 232, as is the case with holder 230, can be structured such that the lid also acts as door to allow the user to selectively transmit and receive data to and from PCD 90 while the PCD is placed in the holder. The user can also charge PCD 90 while the PCD is placed in the holder via the opening of lid 232. Dial 240 and member 242 could accordingly be eliminated.

Figure 16:
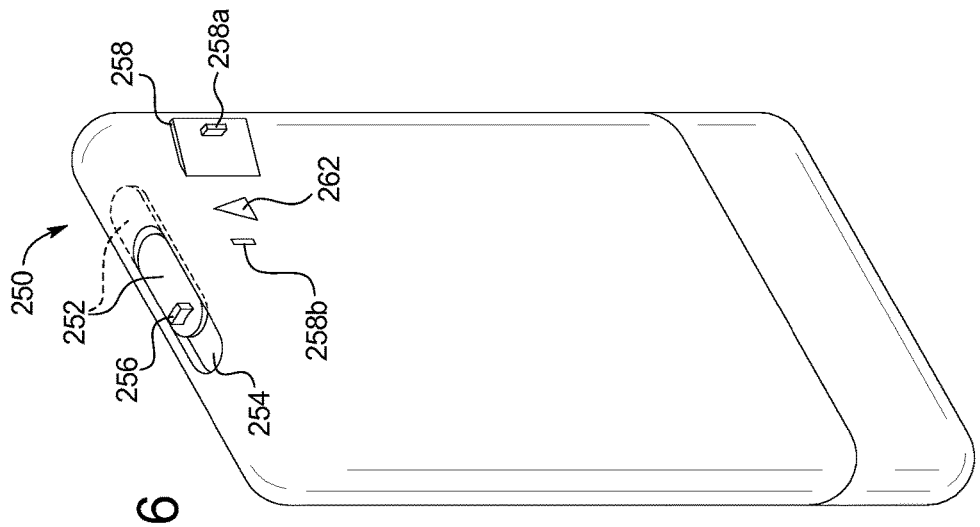
FIG. 16 is a perspective view of one embodiment of a PCD holder of the present disclosure having an alternative opening to selectively allow for data transmission and/or a repeating circuit to selectively allow data transmissions to be repeated and thus received or sent from inside of the holder.

In an alternative embodiment, dial 240 and member 242 are replaced by a sliding door that slides within or beneath a wall of the holder. The door is made of a data transmission blocking material, such as one of materials 10, 12, 14 and 16 discussed above. The door slides open to allow data transmission to and from PCD 90. The door slides closed to block data transmission to and from PCD 90. Holder 250 of FIG. 16 illustrates one example of a slideable or retractable door 252. Door 252 slides within an opening 254 of holder 250. To this end, door 252 includes a tab 256 that enables the user to grasp and slide tab 256 back and forth. Door 252 can be made from any one of the data transmission shielding materials 10, 12, 14 and 16 discussed herein. Alternatively or additionally, door 252 includes a data transmission shielding gasket placed on its sides and/or topside, which also serves to hold door frictionally closed or in a set position.

Door 252 slides within mating grooves formed within the wall of holder 250 or within tracks formed on the underside of the top wall of holder 250. The grooves or tracks extend in one embodiment around the curved or rounded end of opening 254 that receives the tab 256 end of door 252 to provide a hard stop when door 252 is fully closed and completely covering opening 254. The opposite end of opening 254 is free of structure to allow door 252 to be slid open. Tab 256 provides a hard stop when door 252 is fully opened to prevent the door from sliding too far in the open direction.

Door 252 can be located in any desired place on holder 250. Door 252 can be located near an antenna or transmit/receive area of PCD 90. Alternatively or additionally, door 252 is positioned to allow access to the battery charging socket of PCD 90. Here, in addition to enabling the user to selectively allow data to flow to and from PCD 90, the user can also charge their PCD 90 without removing the PCD from protective holder 250.

In an alternative embodiment, door 252 and opening 254 are replaced by a bulkhead connector (not illustrated), which allows the user to insert the charging cord through the holder to charge PCD 90. The bulkhead connector could be molded or formed from any of the materials 10, 12, 14 and 16 above or be filled with signal blocking gasket flaps that are moved temporary out of the way to allow the charging cord to be inserted. The insertion of the charging cord can push the gasket flaps out the way for example. The opening of the gasketing can also serve to selectively allow data to be transferred to or from PCD 90.

The bulkhead connector and door-like gaskets can include or operate with ferrite beads, similar to those placed around computer monitor cables to neutralize RF signals in the cables. The bulkhead connector/gasketing can itself include the ferrite beads or be gasketed against a passive electric ferrite bead component located along the charging cord. In this manner, the user can charge PCD 90 while the holder is data signal blocking and be protected additionally by the ferrite beads against an RF signal running through the charging cord into the holder.

FIGS. 16 and 17 illustrate that holder 250 (and any of the single or multi-compartment holders discussed herein) can have a repeater or repeating circuit 260. FIG. 16 illustrates that the outside of holder 250 is fitted with an antenna 262, which is also shown schematically as part of the repeater circuit 260 of FIG. 17. Hinged door 258 of holder 250 allows antenna 262 to be selectively accessed, e.g., via a living hinge, and in this manner to selectively activate repeater circuit 260. That is, when signal blocking door 258 is closed and releasably locked, e.g., via a tab 258a snap-fitting into a notch 258b, repeater circuit 260 is deactivated. When signal blocking door 258 is opened, data can be transmitted to and from PCD 90 by way of repeating circuit 260. Door 258 can be replaced by an on/off electrical switch in one embodiment. With the on/off switch, reception antenna 262 can remain exposed at all times.

FIG. 17 illustrates one suitable repeating circuit 260. Repeater or bi-directional amplifier ("BDA") 260, as commonly named in the wireless telecommunications industry, boosts the PDA's reception inside holder 250 via a reception antenna 262, a signal amplifier 264 and an internal rebroadcast antenna 266. Reception antenna 262 collects a signal, which is then transmitted to amplifier unit 264, which amplifies the signal, and retransmits the signal within holder 250 to a rebroadcast antenna 266, and vice versa. In particular, reception antenna 262 transmits signals to and receives signals from a wireless access point, cellular antenna, wireless router, or the like. Inner antenna 266 transmits signals to and receives signals from the user's PCD 90, which is placed inside the holder (any of the holders disclosed above). Amplifier unit 264 amplifies the incoming and outgoing signals and rebroadcasts the signal at the same frequency in one embodiment. Amplifier unit 264 can be connected electrically to antennas 262 and 266 as illustrated. A wire 268 runs from receptor antenna 262, through a wall of the holder, e.g., holder 250, to amplifier unit 264.

Repeating circuit 260 is powered in an embodiment by an external battery (not illustrated) placed, e.g., removably, inside the holder. The battery can be rechargeable, in which case the holder can be equipped with a battery recharging socket. In an embodiment, the battery recharging socket is configured the same as that for PCD 90, such that a single power or transformer cord can be used to recharge both PCD 90 and repeating circuit 260. Alternatively, the battery is a replaceable battery.

When the user opens the door 258 or turns on a switch (not illustrated) of holder 250, repeating circuit 260 is activated. PCD 90 can transmit data wirelessly even though the PCD is completely shielded within holder 250. Likewise, repeating circuit 260 allows data to be transmitted into holder 250, where it is relayed to PCD 90.

Referring now to FIGS. 18A to 18E, holder 270 illustrates still another single compartment holder of the present disclosure. Holder 270 is blow or injection molded in one embodiment and is made of any of any of the RF shielded moldable rubbers or plastics discussed herein. Holder 270 is made of two housing portions 272 and 274, which are hinged together, e.g., via a living hinge. Housing portion 272 defines a PCD holding cavity portion Within front surface 272a and sidewalls 272b. Housing portion 274 defines a mating PCD holding cavity within rear surface 274a and sidewalls 274b. The mated cavities are sized to collectively hold PCD 90.

The mating surfaces of three of the sidewalls 272b form a C-shaped tongue 276. The mating surfaces of three of the sidewalls. 274b form a mating C-shaped groove 278. C-shaped tongue 276 and groove 278 lock together releasably to hold holder 270 closed about PCD 90 and to make up for any RF shielding imperfections between the mated sidewalls 272b and 274b. Mating notches 280a and 280b are closed together to form a blind opening along the opposing side of holder 270 from the living hinge to enable the use to pry clamshell housing portions 272 and 274 open when access to PCD 90 is desired.

Bottom walls 272a and 274a define mating notches 272c and 274c, which form an opening to enable the user to plug a charging cord into PCD 90 even when the PCD is inserted into holder 270. The opening can also be left open so that PCD 90 can send and receive data and signals if desired. Alternatively, a notch may only need to be provided in one of clamshell housing portions 272 and 274. A plug 282 is tethered to one of clamshell housing portions 272 and 274 (here clamshell half 272) via a strap 284. The user can insert plug 282 into the opening formed by notches 272c and 274c to make holder 270 completely data transmission blocking. The user can then remove plug 282 from the mated notches 272c and 274c to receive incoming transmissions and/or to charge PCD 90.

Figure 18A:
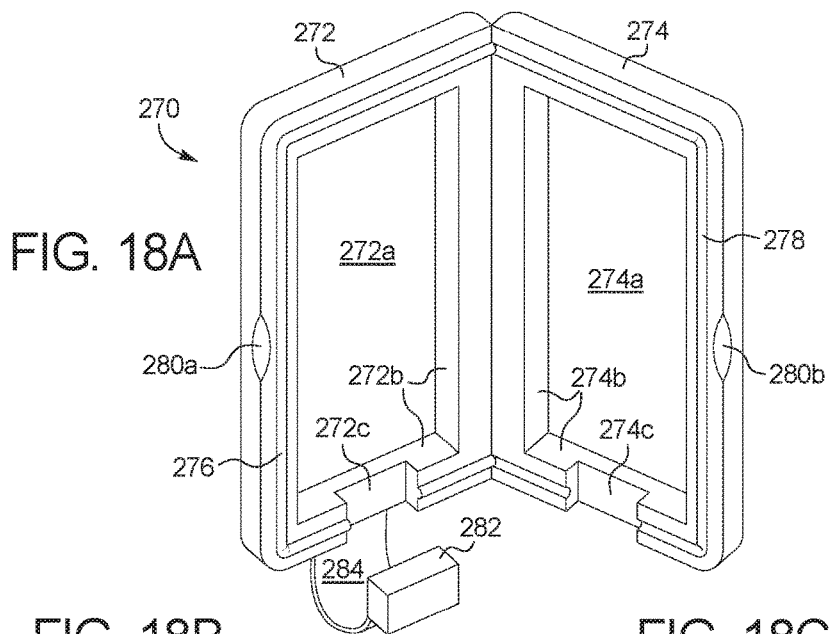
FIGS. 18A to 18E illustrate various aspects of another PCD holder of the present disclosure.
Figure 18B:
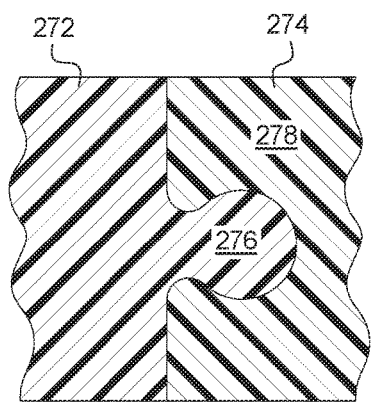
Figure 18C:
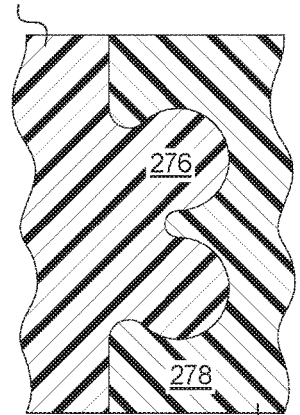

FIGS. 18B and 18C illustrate various embodiments for tongue 276 and groove 278 formed in clamshells 272 and 274, respectively. FIG. 18B illustrates a single-lobed tongue 276 and mating groove 278, which snap- or press-fit sealingly and removably together. FIG. 18C illustrates a double-lobed tongue 276 and mating groove 278, which snap- or press-lit sealingly and removably together. Tongue 276 and mating groove 278 are configured to allow clamshells 272 and 274 to be easily mated and closed, to stay closed when it is desired to protect and shield PCD 90, and to be opened when needed without requiring undue effort.

Figure 18D:
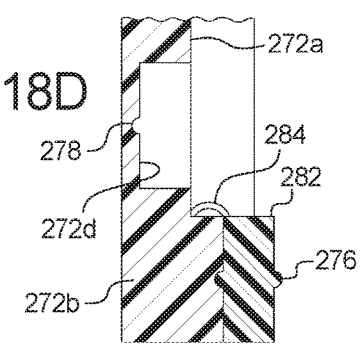
Figure 18E:
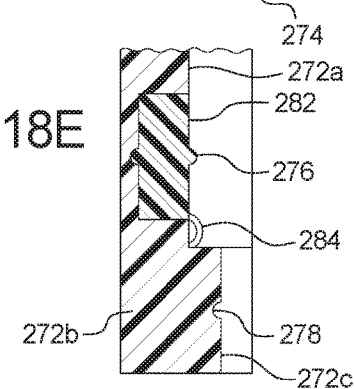

FIGS. 18D and 18E illustrate a desirable alternative to the plug 282 and strap 284 shown in FIG. 18A. Plug 282 and strap 284 shown in FIG. 18A adequately provide the user with the ability to plug holder 270 completely for signal transmission blocking or to enable holder 270 to be opened so that PCD 90 can be charged or receive data. However, plug 282 and strap 284 shown in FIG. 18A are loose when plug 282 is not inserted, which may necessitate additional structure to capture loose plug 282 to prevent the plug from being torn away from holder 270. FIGS. 18D and 18E provide a sleek and efficient solution. Here, front surface 272a is formed on its inner surface with a notch 272d, which can accept plug 282 when the user desires for holder 270 to allow data signals to be transferred to and from PCD 90. Here, plug 282 is tethered instead via a short strap 284 to an inner surface of clamshell portion 272 (e.g., at the corner of front face 272a and bottom sidewall 272b). That is, strap 284 is located inside the cavity of holder 270. Plug 282 accordingly folds conveniently out of the way when total isolation is not desired and/or the user desires to charge PCD 90.

In particular, FIG. 18D illustrates a situation in which the user desires holder 270 to be completely signal blocking. Plug 282 and associated tongue 276 are pressed against the mating surface of bottom sidewall 272b and associated groove 278. Plug 282 fills the opening formed by notches 272c and 274c when clamshell portions 272 and 274 are mated. Plug 282 can include tongues 276 on both surfaces as illustrated or have some combination of tongue 276 and groove 278. Or, grooves 278 can be provided on both surfaces of plug 282. The tongues and grooves on bottom sidewalls 272b and 274b are adjusted accordingly.

In FIG. 18E, plug 282 is folded up into the inner surface of front face 272a via notch 272d. Here, holder 270 is not signal isolated. PCD 90 can send and receive data and be charged. Strap 284 tethers plug 282 to clamshell portion 272 in both the positions of FIGS. 18D and 18E. Plug 282 never extends outside of clamshell portions 272 and 274. Holder 270 accordingly maintains a smooth, sleek appearance in both signal blocking and receiving/charging modes. The clamshell configuration of holder 270 also enables PCD 90 to rest in one of clamshell housing portions 272 and 274 and be operated by the user.

Figure 19:
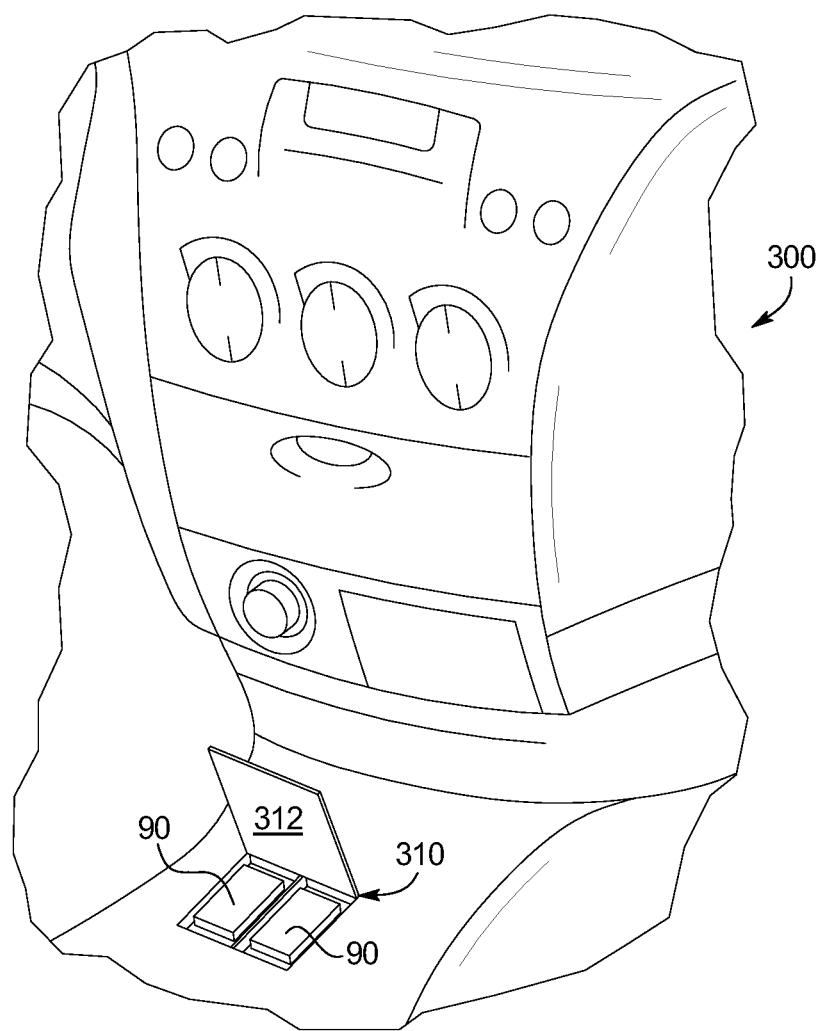
FIG. 19 is a perspective view of one embodiment of an automobile console/dashboard having any of the signal blocking holders of the present disclosure integrated or placed removably therein.

Referring now to FIG. 19, one embodiment of an automobile console/dashboard 300 having any of the signal blocking holders of the present disclosure integrated or placed removably therein is illustrated. Console/dashboard 300 can have a built-in or integrated holder 310 as illustrated. Holder 310 can have a body/lid arrangement as shown in FIG. 19, or have any other suitable configuration discussed herein. Holder 310 can be single or multi-compartment and may or may not be gasketed, windowed or mirrored. Holder 310, including lid 312 and each of the sidewalls and bottom wall of holder 310, can be made of any of the signal blocking materials discussed herein including any of materials 10, 12, 14 or 16. Holder 310 can be made via any injection, stamping or other process discussed herein. Alternatively, one of more slots or docking stations, e.g., similar to the stations of separator 124, is provided to releasably hold any of the holders discussed herein.

Additional Aspects of the Present Disclosure

Aspects of the subject matter described herein may be useful alone or in combination one or more other aspect described herein. Without limiting the foregoing description, in a first aspect of the present disclosure, a personal communication device ("PCD") holder includes: an at least semi-rigid housing having a base wall and at least one side wall extending from the base wall so as to form a housing into which a user can place a PCD, the base wall and the at least one side wall including a conductive material so that the base wall and the at least one side wall bock are data signal blocking; and a lid configured to be moveable with respect to the housing so as to enable the user to (i) place the PCD into the housing and (ii) securely and releasably close the lid onto the housing, the lid also including a conductive material so that when the lid is closed onto the housing, the holder is data signal blocking, preventing a data signal from reaching the PCD.

In accordance with a second aspect of the present disclosure, which may be used in combination with the first aspect, the lid is slideable with respect to the housing.

In accordance with a third aspect of the present disclosure, which may be used in combination with any one or more of the preceding aspects, the lid is hingedly connected to the housing.

In accordance with a fourth aspect of the present disclosure, which may be used in combination with any one or more of the preceding aspects, the lid is configured to be securely and releasably closed onto the at least one side wall.

In accordance with a fifth aspect of the present disclosure, which may be used in combination with any one or more of the preceding aspects, at least one of the base wall, the at least one side wall and the lid is a solid a conductive wall.

In accordance with a sixth aspect of the present disclosure, which may be used in combination with any one or more of the preceding aspects, at least one of the base wall, the at least one side wall and the lid includes a conductive layer attached to at least one synthetic layer.

In accordance with a seventh aspect of the present disclosure, which may be used in combination with any one or more of the preceding aspects, at least one of the base wall, the at least one side wall and the lid includes a metal-impregnated synthetic material.

In accordance with an eighth aspect of the present disclosure, which may be used in combination with any one or more of the preceding aspects, at least one of the base wall, the at least one side wall and the lid includes a conductive layer coupled to an organic material.

In accordance with a ninth aspect of the present disclosure, which may be used in combination with any one or more of the preceding aspects, the housing is a first housing, and wherein the lid is part of a second housing, the First housing slidingly engaging the second housing.

In accordance with a tenth aspect of the present disclosure, which may be used in combination with the ninth aspect, the lid is the only conductive material containing wall of the second housing.

In accordance with an eleventh aspect of the present disclosure, which may be used in combination with any one or more of the preceding aspects, the housing is formed by placing a mandrel inside of the base wall and the at least one side wall and inserting a synthetic material between the mandrel and the base and side walls.

In accordance with a twelfth aspect of the present disclosure, which may be used in combination with the eleventh aspect, the lid is translated onto and off of the housing and/or the mandrel is of a size at least as big as the PCD.

In accordance with a thirteenth aspect of the present disclosure, which may be used in combination with any one or more of the preceding aspects, the PCD holder includes an illumination source that becomes illuminated to indicate that the PCD holder is data signal blocking.

In accordance with a fourteenth aspect of the present disclosure, which may be used in combination with any one or more of the preceding aspects, the conductive material of the base wall, the at least one side wall and the lid is continuous, discontinuous, perforated or meshed.

In accordance with a fifteenth aspect of the present disclosure, which may be used in combination with any one or more of the preceding aspects, a personal communication device ("PCD") holder includes: a first housing having a base wall and a plurality of side walls extending from the base wall so as to form a housing into which a user can place a PCD, at least one of the sidewalls including a conductive material so that the at least one side wall bock is data signal blocking; and a second housing configured to be moveable with respect to the first housing so as to enable the user to (i) place the PCD into the first housing and (ii) releasable secure the second housing over the first housing, the second housing configured such that (a) the sidewall of the first housing that includes the conductive material is exposed when the second housing is releasably secured over the first housing and (b) each wall of the second housing that abuts a non-conductive material containing wall of the first housing when the second housing is releasable secured over the first housing includes a conductive material, such that combined first and second housings are data signal blocking.

In accordance with a sixteenth aspect of the present disclosure, which may be used with any one or more of the preceding aspects in combination with the fifteenth aspect, the exposed sidewall of the first housing includes an apparatus for grasping and pulling the first housing from the second housing.

In accordance with a seventeenth aspect of the present disclosure, which may be used with any one or more of the preceding aspects in combination with the fifteenth aspect, the first and second housings include mating structures for releasably securing the second housing to the first housing.

In accordance with an eighteenth aspect of the present disclosure, which may be used in combination with any one or more of the preceding aspects, a personal communication device ("PCD") holder includes: an at least semi-rigid housing having a base wall and at least one side wall extending from the base wall so as to form a housing sized such that multiple users can place their PCD's, the base wall and the at least one side wall including a conductive material so that the base wall and the at least one side wall bock are data signal blocking; and a lid configured to be moveable with respect to the housing so as to enable the users to (i) place the PCD's into the housing and (ii) securely and releasably close the lid onto the housing, the lid also including a conductive material so that when the lid is closed onto the housing, the holder is data signal blocking, preventing a data signal from reaching the PCD's.

In accordance with a nineteenth aspect of the present disclosure, which may be used with any one or more of the preceding aspects in combination with the eighteenth aspect, the housing includes a divider for compartmentalizing the multiple PCD's.

In accordance with a twentieth aspect of the present disclosure, which may be used with any one or more of the preceding aspects in combination with the eighteenth aspect, the PCD holder includes a plurality of markers, each user placing their PCD into the housing receiving one of the markers to use for retrieving their PCD and/or the PCD holder is provided as part of a larger piece of furniture or structure.

In accordance with a twenty-first aspect of the present disclosure, which may be used in combination with any one or more of the preceding aspects, a personal communication device ("PCD") holder includes (i) a first housing portion including a material that causes the first housing portion to be data signal blocking; (ii) a second housing portion including a material that causes the second housing portion to be data signal blocking; and (iii) a data signal blocking gasket fitted to at least one of the first and second housing portions, the gasket positioned and arranged such that when the first and second housing portions are mated together to form an enclosure about the PCD, the data signal blocking gasket engages and seals to the other of the first and second housing portions to ensure that the enclosure is completely data signal blocking regardless of whether imperfections are present in an interface between the mated first and second portions.

In accordance with a twenty-second aspect of the present disclosure, which may be used with any one or more of the preceding aspects in combination with the twenty-first aspect, the data signal blocking materials of the first and second housing portions are the same materials.

In accordance with a twenty-third aspect of the present disclosure, which may be used with any one or more of the preceding aspects in combination with the twenty-first aspect, the data signal blocking gasket is of a different material than the data signal blocking materials of the first and second housing portions.

In accordance with a twenty-fourth aspect of the present disclosure, which may be used with any one or more of the preceding aspects in combination with the twenty-first aspect, the data signal blocking gasket is formed as part of the first or the second housing portion.

In accordance with a twenty-fifth aspect of the present disclosure, which may be used with any one or more of the preceding aspects in combination with the twenty-first aspect, the data signal blocking gasket is formed as a tongue that mates with a groove formed by the other of the first and second housing portions.

In accordance with a twenty-sixth aspect of the present disclosure, which may be used with any one or more of the preceding aspects in combination with the twenty-first aspect, the first housing portion slides over the second housing portion to form the enclosure, and the gasket is placed at mating open ends of the first and second housing portions.

In accordance with a twenty-seventh aspect of the present disclosure, which may be used with any one or more of the preceding aspects in combination with the twenty-first aspect, the first housing portion slides against the second housing portion to form the enclosure, and the is gasket placed at mating slideably engaging sides of the first and second housing portions.

In accordance with a twenty-eighth aspect of the present disclosure, which may be used with any one or more of the preceding aspects in combination with the twenty-seventh aspect, the gasket is further placed at an abutting interface between the first and second housing portions.

In accordance with a twenty-ninth aspect of the present disclosure, which may be used with any one or more of the preceding aspects in combination with the twenty-first aspect, the first housing portion is a main body portion and the second housing portion is a lid that connects hingedly to the main body portion, and the gasket is located between the main body portion and the lid.

In accordance with a thirtieth aspect of the present disclosure, which may be used with any one or more of the preceding aspects in combination with the twenty-first aspect, the first and second housing portions are clamshells hinged together.

In accordance with a thirty-first aspect of the present disclosure, which may be used with any one or more of the preceding aspects in combination with the twenty-first aspect, at least one of the first and second housing portions is selectively openable while the enclosure is maintained to allow the PCD to receive a data transmission.

In accordance with a thirty-second aspect of the present disclosure, which may be used with any one or more of the preceding aspects in combination with the twenty-first aspect, at least one of the first and second housing portions is selectively openable while the enclosure is maintained to charge the PCD.

In accordance with a thirty-third aspect of the present disclosure, which may be used with any one or more of the preceding aspects in combination with the twenty-first aspect, the PCD holder includes a repealer circuit positioned and arranged to selectively allow the PCD to receive a data transmission.

In accordance with a thirty-fourth aspect of the present disclosure, which may be used in combination with any one or more of the preceding aspects, a personal communication device ("PCD") holder includes (i) a first injection molded housing portion including a material that causes the first housing portion to be data signal blocking; (ii) a second injection molded housing portion including a material that causes the second housing portion to be data signal blocking; and (iii) wherein at least one of the first and second housing portions is selectively openable while the enclosure is maintained to allow the PCD to receive a data transmission.

In accordance with a thirty-fifth aspect of the present disclosure, which may be used with any one or more of the preceding aspects in combination with the thirty-fourth aspect, the PCD holder further includes a data signal blocking gasket fitted to at least one of the first and second housing portions.

In accordance with a thirty-sixth aspect of the present disclosure, which may be used with any one or more of the preceding aspects in combination with the thirty-fourth aspect, an opening formed to selectively allow the PCD to receive a data transmission is further positioned and arranged to enable the PCD to be charged.

In accordance with a thirty-seventh aspect of the present disclosure, which may be used with any one or more of the preceding aspects in combination with the thirty-fourth aspect, an opening formed to allow the PCD to receive a data transmission is selectively plugged via a plug that folds up into the enclosure when the PCD is allowed to receive the data transmission.

In accordance with a thirty-eighth aspect of the present disclosure, which may be used in combination with any one or more of the preceding aspects, a personal communication device ("PCD") holder includes (i) a first injection molded housing portion including a material that causes the first housing portion to be data signal blocking; (ii) a second injection molded housing portion including a material that causes the second housing portion to be data signal blocking: and (iii) wherein at least one of the first and second injection molded housing portions is made of any one or more conductively filled material selected from: acrylonitrile butadiene styrenes ("ABS"), polyether block amides ("PEBA"), polyamide alloys (PA Alloys), polyamide 12 ("PA12"), polyamide 6 ("PA6"), polyamide 6/10 ("PA6/10"), polyamide 6/6 ("PA6/6"), high density polyethylene ("HDPE"), thermoplastic polyurethanes ("TPU"), or styrene ethylene butylene styrene block copolymer ("SEBS").

In accordance with a thirty-ninth aspect of the present disclosure, which may be used with any one or more of the preceding aspects in combination with the thirty-eighth aspect, the conductively filled material is filled via any one or material selected from tungsten, copper, or stainless steel.

In accordance with a fortieth aspect of the present disclosure, which may be used with any one or more of the preceding aspects in combination with the thirty-eighth aspect, the conductively filled material is loaded sufficiently such that the first and injection molded housing portions mated together form an enclosure that is data signal blocking.

In accordance with a forty-first aspect of the present disclosure, any of the structure and functionality illustrated and described in connection with FIG. 1 may be used in combination with any one or more of the preceding aspects.

in accordance with a forty-second aspect of the present disclosure, any of the structure and functionality illustrated and described in connection with FIG. 2 may be used in combination with any one or more of the preceding aspects.

In accordance with a forty-third aspect of the present disclosure, any of the structure and functionality illustrated and described in connection with FIG. 3 may be used in combination with any one or more of the preceding aspects.

In accordance with a forth-fourth aspect of the present disclosure, any of the structure and functionality illustrated and described in connection with FIG. 4 may be used in combination with any one or more of the preceding aspects.

In accordance with a forty-fifth aspect of the present disclosure, any of the structure and functionality illustrated and described in connection with FIG. 5 may be used in combination with any one or more of the preceding aspects.

In accordance with a forty-sixth aspect of the present disclosure, any of the structure and functionality illustrated and described in connection with FIG. 6 may be used in combination with any one or more of the preceding aspects.

In accordance with a forty-seventh aspect of the present disclosure, any of the structure and functionality illustrated and described in connection with FIG. 7 may be used in combination with any one or more of the preceding aspects.

In accordance with a forty-eighth aspect of the present disclosure, any of the structure and functionality illustrated and described in connection with FIG. 8 may be used in combination with any one or more of the preceding aspects.

In accordance with a forty-ninth aspect of the present disclosure, any of the structure and functionality illustrated and described in connection with FIG. 9 may be used in combination with any one or more of the preceding aspects.

In accordance with a fiftieth aspect of the present disclosure, any of the structure and functionality illustrated and described in connection with FIG. 10 may be used in combination with any one or more of the preceding aspects.

In accordance with a fifty-first aspect of the present disclosure, any of the structure and functionality illustrated and described in connection with FIGS. 11A and 11B may be used in combination with any one or more of the preceding aspects.

In accordance with a fifty-second aspect of the present disclosure, any of the structure and functionality illustrated and described in connection with FIGS. 12A and 12B may be used in combination with any one or more of the preceding aspects.

In accordance with a fifty-third aspect of the present disclosure, any of the structure and functionality illustrated and described in connection with FIGS. 13A and 13B may be used in combination with any one or more of the preceding aspects.

In accordance with a fifty-fourth aspect of the present disclosure, any of the structure and functionality illustrated and described in connection with FIG. 14 may be used in combination with any one or more of the preceding aspects.

In accordance with a fifty-fifth aspect of the present disclosure, any of the structure and functionality illustrated and described in connection with FIGS. 15 to 17 may be used in combination with any one or more of the preceding aspects.

In accordance with a fifty-sixth aspect of the present disclosure, any of the structure and functionality illustrated and described in connection with FIGS. 18A to 18E may be used in combination with any one or more of the preceding aspects.

In accordance with a fifty-seventh aspect of the present disclosure, any of the structure and functionality illustrated and described in connection with FIG. 19 may be used in combination with any one or more of the preceding aspects.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A personal communication device "PCD" holder comprising:
    a first injection molded housing portion including a material that causes the first housing portion to be data signal blocking;
    a second injection molded housing portion including a material that causes the second housing portion to be data signal blocking; and
    wherein the first and second housing portions each include a notch, wherein the notches combine to form an opening when the first and second housing portions are mated together to allow the PCD to receive a data transmission, the mated notches selectively plugged via a plug that folds up into an additional notch provided in one of the first or second housing portions to unplug the mated notches and allow the PCD to receive the data transmission.

2. The PCD holder of claim 1, further including a data signal blocking gasket fitted to at least one of the first and second housing portions.

3. The PCD holder of claim 1, wherein the mated notches formed to selectively allow the PCD to receive a data transmission are positioned directly adjacent to the PCD to enable the PCD to be charged.

4. The PCD holder of claim 1, wherein the plug is connected to an inside surface of one of the first or second housing portions via a strap.

5. The PCD holder of claim 1, wherein the additional notch is provided on an inside surface of the first or second housing portion.

6. The PCD holder of claim 1, wherein the notches are shaped at least substantially the same.

7. A personal communication device "PCD" holder comprising:
    a first housing portion including a material that causes the first housing portion to be data signal blocking, the first housing portion including a first notch;
    a second housing portion including a material that causes the second housing portion to be data signal blocking, the second housing portion including a second notch; and
    wherein the first and second notches are positioned and arranged to mate when the first and second housing portions are closed together forming an opening the mated first and second notches selectively plugged via a plug that blocks the PCD from receiving a data transmission, and wherein the plug folds up into a notch provided in one of the first or second housing portions to unplug the mated first and second openings and allow the PCD to receive the data transmission.

8. The PCD holder of claim 7, further including a data signal blocking gasket fitted to at least one of the first and second housing portions.

9. The PCD holder of claim 7, wherein the mated first and second notches formed to selectively allow the PCD to receive a data transmission are positioned directly adjacent to the PCD to enable the PCD to be charged.

10. The PCD holder of claim 7, wherein the plug is connected to an inside surface of one of the first or second housing portions via a strap.

11. The PCD holder of claim 10, wherein the strap is connected to the inside surface of the first or second housing portion directly adjacent to the additional notch.

12. The PCD holder of claim 7, wherein the additional notch is provided on an inside surface of the first or second housing portion.

13. The PCD holder of claim 7, wherein the first and second notches are shaped at least substantially the same.

14. The PCD holder of claim 7, wherein at least one of the first or second housing portions is injection molded.

15. The PCD holder of claim 7, wherein the first and second housing portions are hinged together.

16. The PCD holder of claim 7, wherein at least one of the first or second housing portions is made of metal.

17. The PCD holder of claim 7, wherein at least one of the first or second housing portions is made of a material injected with conductive particles.

18. The PCD holder of claim 7, wherein at least one of the first or second housing portions is made of a conductive layer applied to an electrically insulating layer.

19. A personal communication device "PCD" holder comprising:
a first housing portion including a material that causes the first housing portion to be data signal blocking;
a second housing portion including a material that causes the second housing portion to be data signal blocking, at least one of the first or second housing portions including a notch extending through an edge of the first or second housing portion; and
wherein the at least one notch is selectively plugged via a plug that blocks the PCD from receiving data transmission, wherein the plug folds up into an additional notch provided in one of the first or second housing portions to unplug the opening and allow the PCD to receive the data transmission, and wherein the plug is connected via a strap to the first or second housing portion adjacent to the additional notch.

20. The PCD holder of claim 19, wherein the at least one notch formed to selectively allow the PCD to receive a data transmission is positioned directly adjacent to the PCD to enable the PCD to be charged.

21. The PCD holder of claim 19, wherein at least one of the first or second housing portions is injection molded.

22. The PCD holder of claim 19, wherein the first and second housing portions are hinged together.

23. The PCD holder of claim 19, wherein at least one of the first or second housing portions is made of metal.

24. The PCD holder of claim 19, wherein at least one of the first or second housing portions is made of a material injected with conductive particles.

25. The PCD holder of claim 19, wherein at least one of the first or second housing portions is made of a conductive layer applied to an electrically insulating layer.

* * * * *